US012672529B2

(12) United States Patent
Chen et al.

(10) Patent No.: US 12,672,529 B2
(45) Date of Patent: Jun. 30, 2026

(54) MANUFACTURING METHOD FOR DEVICE EMBEDDED PACKAGING STRUCTURE

(71) Applicant: Zhuhai ACCESS Semiconductor Co., Ltd, Guangdong (CN)

(72) Inventors: Xianming Chen, Guangdong (CN); Benxia Huang, Guangdong (CN); Lei Feng, Guangdong (CN); Jindong Feng, Guangdong (CN); Yejie Hong, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 371 days.

(21) Appl. No.: 18/221,004

(22) Filed: Jul. 12, 2023

(65) Prior Publication Data

US 2024/0063055 A1 Feb. 22, 2024

(30) Foreign Application Priority Data

Aug. 17, 2022 (CN) .......................... 202210994320.8

(51) Int. Cl.
*H10P 14/68* (2026.01)
*H10P 14/20* (2026.01)
(Continued)

(52) U.S. Cl.
CPC ......... *H10W 20/083* (2026.01); *H10P 14/274* (2026.01); *H10P 14/6532* (2026.01);
(Continued)

(58) Field of Classification Search
CPC ......... H01L 23/5389; H01L 23/49827; H10W 70/614
See application file for complete search history.

(56) References Cited

U.S. PATENT DOCUMENTS 5,257,000 A * 10/1993 Billings ................ H01F 41/046
336/200
2010/0006330 A1* 1/2010 Fu ........................... H01L 24/19
29/856
(Continued)

FOREIGN PATENT DOCUMENTS

CN 102646628 B 8/2014
CN 106997870 B 11/2019
(Continued)

OTHER PUBLICATIONS

CN-112820713-A Machine Language Translation (Year: 2021).*

*Primary Examiner* — Erik Kielin
(74) *Attorney, Agent, or Firm* — The PL Law Group, PLLC

(57) ABSTRACT

A method for manufacturing a device embedded packaging structure include laminating a first dielectric material on a copper foil to form a first dielectric layer, and forming a first feature pattern in the first dielectric layer to expose the copper foil, etching the exposed copper foil to form a device opening frame and a via post opening frame to obtain a metal frame, applying an adhesive layer on the metal frame, and mounting a device to the adhesive layer in the device opening frame, laminating a second dielectric material to form a second dielectric layer covering the metal frame and filling the device opening frame and the via post opening frame, forming a via post in the via post opening frame, and forming a first wiring layer and a second wiring layer conductively connected by the via post on the upper and lower surfaces of the second dielectric layer.

20 Claims, 23 Drawing Sheets

(51) Int. Cl.
    *H10P 14/60*       (2026.01)
    *H10P 50/00*       (2026.01)
    *H10W 20/00*       (2026.01)

(52) U.S. Cl.
    CPC .............. *H10P 14/68* (2026.01); *H10P 50/71*
        (2026.01); *H10W 20/043* (2026.01); *H10W*
        *20/044* (2026.01); *H10W 20/054* (2026.01);
                    *H10W 20/075* (2026.01)

(56)             References Cited

U.S. PATENT DOCUMENTS

| | | | |
|---|---|---|---|
| 2012/0229990 A1* | 9/2012 | Adachi ................. | H01L 23/142 |
| | | | 156/278 |
| 2020/0163218 A1* | 5/2020 | Mok ...................... | H05K 1/185 |
| 2021/0210427 A1* | 7/2021 | Kang ...................... | H01L 24/20 |
| 2021/0305699 A1* | 9/2021 | Min ....................... | H01Q 1/523 |
| 2022/0068760 A1* | 3/2022 | Chen ...................... | H01L 24/19 |

FOREIGN PATENT DOCUMENTS

| CN | 112164677 A | * | 1/2021 | ............. | H01L 24/19 |
|---|---|---|---|---|---|
| CN | 112820713 A | * | 5/2021 | ....... | H01L 23/49838 |

* cited by examiner

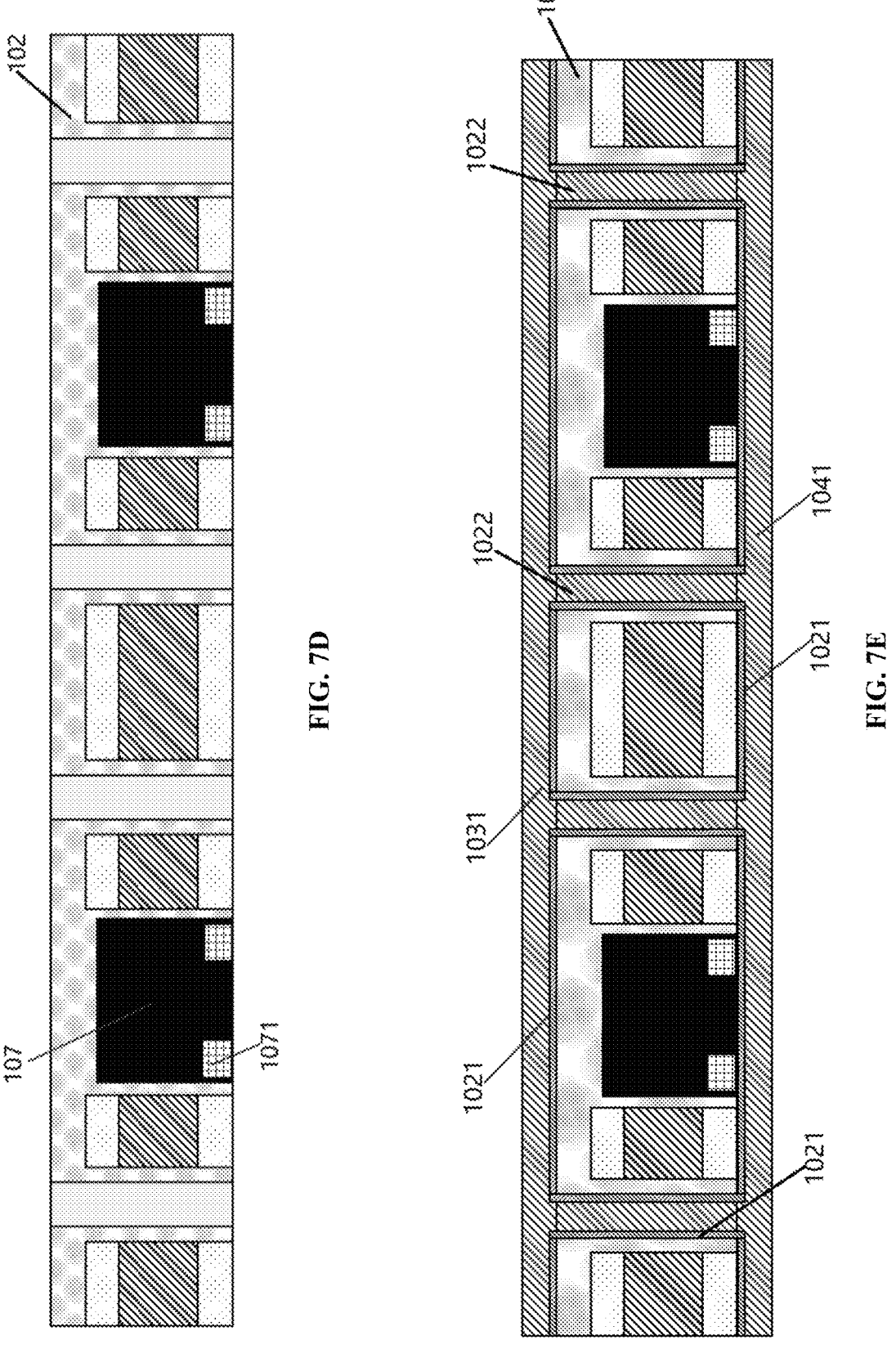

MANUFACTURING METHOD FOR DEVICE EMBEDDED PACKAGING STRUCTURE

CROSS-REFERENCE TO RELATED APPLICATION AND CLAIM OF PRIORITY

This application claims the benefit under 35 USC § 119 of Chinese Patent Application No. 2022109943208, filed on Aug. 17, 2022, in the China Intellectual Property Office, the entire disclosure of which is incorporated herein by reference for all purposes.

BACKGROUND

1. Technical Field

The present invention relates to the field of electronic device packaging, and specifically to a manufacturing method for a device embedded packaging structure.

2. Background Art

With the development of electronic technology, electronic products become more and more miniaturized and intelligent in recent years. Correspondingly, the requirements for the core substrates and components that make up the electronic products are higher and higher. Lower thickness, smaller areas, higher performance, and more functions have become key factors in the lightness and thinness of electronic products. How to achieve this key factors has became the trend pursued by manufacturers for substrates and components. Providing a device embedded packaging structure becomes a miniaturized and modular solution, but miniaturization and modularization are reasons for a higher line density and a higher manufacturing cost of a package. How to simplify the process to reduce the manufacturing cost of packaging modules and reduce the volume of packages has become a problem to be solved by each large-scale manufacturer.

The Chinese patent publication CN102646628B discloses a semiconductor device. As shown in FIG. 1, when manufacturing a semiconductor device, a metal plate 11 is first prepared, a resin material 12 is laminated on one side of the metal plate 11, a cavity structure 16 is etched on the opposite side of the metal plate 11, an adhesive material 15 is filled in the etched cavity structure 16 and a chip 14 is attached therein, and a dielectric layer 18 is laminated to perform a layer building-up process.

However, when manufacturing the semiconductor device, an adhesive layer needs to be implanted which is difficult and time-consuming to apply, and the amount of the adhesive layer is difficult to control, resulting in a wave fluctuation of the chip in the thickness direction and affecting the subsequent wiring; in addition, in the prior art, it is difficult to manage and control the processing of the packaging structure and the warping of the finished product due to the single-sided layering, and the thickness of the package is thicker than that of the double-sided layering.

In addition, the Chinese patent publication CN106997870B discloses an embedded packaging structure. As shown in FIG. 2, the manufacturing of the embedded packaging structure includes two parts as follows:

one is making a rectangular cavity array polymer matrix, as shown in FIG. 3;

the second is implementing device embedding treatment on the basis of the polymer matrix.

The specific implementation modes include: firstly, preparing a temporary bearing plate DTF and performing patterning treatment on the same; secondly, electroplating a conductive copper post 24, and laminating a dielectric layer 28 after film removal; then thinning the dielectric layer 28 to a specified thickness and exposing the surface of each conductive copper post 24; then etching the metal layer on the substrate exposed after removal of the temporary bearing plate, and performing a pattern etching to form a frame for a mounted device; then attaching a temporary tape, and laminating a dielectric layer after attaching the device 22; then thinning the dielectric layer to expose the conductive copper post 24 and metallizing the surface, and implementing a line layer building-up process; and finally, implementing layer building-up and solder resist and surface metallization as required.

However, the packaging and embedding needs to be completed in two parts, the technical process flow is complicated and long-time, resulting in high manufacturing cost.

SUMMARY

Embodiments of the present invention involve providing a manufacturing method for a device embedded packaging structure to solve the above technical problems. The present invention greatly reduces the manufacturing steps, improves the production efficiency, and reduces the manufacturing cost by optimizing the process flow such that the processing is simple and controllable, the thickness of the dielectric layer is controllable, and the uniformity is improved. In addition, in the processing, there is no need to preset an adhesive layer at the bottom of the opening frame, which well solves the problem of the prior art that an adhesive layer needs to be accurately applied, and each device is at a relatively horizontal reference plane which solves the difficulty of layer building-up and conducting caused by the fluctuation of the subsequent embedded device; the copper foil is preset in the dielectric layer to form a metal frame, which improves the heat dissipation efficiency.

The first aspect of the present invention relates to a manufacturing method for a device embedded packaging structure, including the following steps:

(a) laminating a first dielectric material on at least one face of a copper foil to form a first dielectric layer, and forming a first feature pattern in the first dielectric layer to expose the copper foil;

(b) etching exposed copper foil to form a device opening frame and a via post opening frame so as to obtain a metal frame;

(c) applying an adhesive layer on the bottom surface of the metal frame, and mounting a device on the adhesive layer in the device opening frame;

(d) laminating a second dielectric material to form a second dielectric layer, wherein the second dielectric layer covers the metal frame and fills the device opening frame and the via post opening frame; and (e) forming a via post in the via post opening frame, and forming a first wiring layer and a second wiring layer which are conductively connected by the via post respectively on an upper surface and a lower surface of the second dielectric layer.

In some embodiments, the first dielectric material and the second dielectric material may be the same or different.

In some embodiments, the first dielectric material and/or the second dielectric material includes an inorganic filler reinforced polymer matrix. Preferably, the polymer matrix is selected from a polyimide, an epoxy resin, a bismaleimide triazine resin, a polyphenylene ether, or a combination thereof. Preferably, the inorganic filler is selected from ceramic fillers, glass fibers or combinations thereof. More preferably, the polymer matrix is a photosensitive polymer resin such as a photosensitive polyimide resin or a photosensitive polyphenylene ether resin.

In some embodiments, step (a) further includes roughening the surface of the copper foil to increase the surface area of the copper foil surface to facilitate increased adhesive force.

In some embodiments, step (a) further includes forming a first feature pattern in the first dielectric layer by means of laser drilling, mechanical drilling, plasma etching, or exposure and development.

In some embodiments, the adhesive layer in step (b) includes an adhesive tape, such as an adhesive tape capable of losing adhesion by heating or ultraviolet light irradiation.

In some embodiments, step (c) includes attaching a terminal surface of the device onto the adhesive layer in the device opening frame.

In some embodiments, step (d) further includes removing the adhesive layer after laminating the second dielectric material on the top surface of the metal frame to form the second dielectric layer.

In some embodiments, step (d) further includes, after removing the adhesive layer, laminating the second dielectric material on the bottom surface of the metal frame as well to form the second dielectric layer.

In some embodiments, step (e) includes:

(e1) forming a via in the via post opening frame;

(e2) depositing a first metal seed layer in the via and on the upper surface and the lower surface of the second dielectric layer;

(e3) electroplating copper on the first metal seed layer, forming a via post in the via, and respectively forming a first copper layer and a second copper layer on the upper surface and the lower surface of the second dielectric layer;

(e4) etching the first copper layer and the second copper layer to respectively form the first wiring layer and the second wiring layer; and (e5) etching the exposed first metal seed layer.

In some embodiments, step (e4) further includes:

respectively applying a first photoresist layer and a second photoresist layer on the first copper layer and the second copper layer, and patterning the first photoresist layer and the second photoresist layer to expose the first copper layer and the second copper layer;

respectively etching exposed first copper layer and second copper layer to form the first wiring layer and the second wiring layer; and removing the first photoresist layer and the second photoresist layer.

In some embodiments, the first metal seed layer is deposited by means of electroless plating or sputtering. Preferably, the first metal seed layer includes titanium, copper, titanium tungsten alloy, or a combination thereof.

In some embodiments, the manufacturing method further includes applying a first solder resist layer and a second solder resist layer on the first wiring layer and the second wiring layer, respectively, and treating the exposed metal surface to form a solder resist window.

In some embodiments, the manufacturing method further includes the following steps:

(f) performing layer-increasing process on the first wiring layer and/or the second wiring layer to form an additional layer so as to form a multilayer interconnected structure.

Preferably, the additional layer includes a dielectric layer and a wiring layer.

Preferably, step (f) further includes applying a solder resist layer on an outermost side wiring layer and treating an exposed metal surface to form a solder resist window.

BRIEF DESCRIPTION OF THE DRAWINGS

For a better understanding of the present invention and to show implementation modes thereof, reference will now be made below, purely by way of example, to the accompanying drawings.

With specific reference to the accompanying drawings, it is stressed that the particular illustrations are by way of examples and for purposes of illustrative discussion of the preferred embodiments of the present invention only, and are presented in the cause of providing what is believed to be the most useful and readily understood illustration of the description of the principles and conceptual aspects of the present invention. In this regard, no attempt is made to show structural details of the invention in more details than is necessary for a fundamental understanding of the invention; the description taken with the drawings makes it apparent to those skilled in the art how the several forms of the present invention may be embodied in practice. In the drawings.

DETAILED DESCRIPTION OF THE EMBODIMENTS

Figure 1:
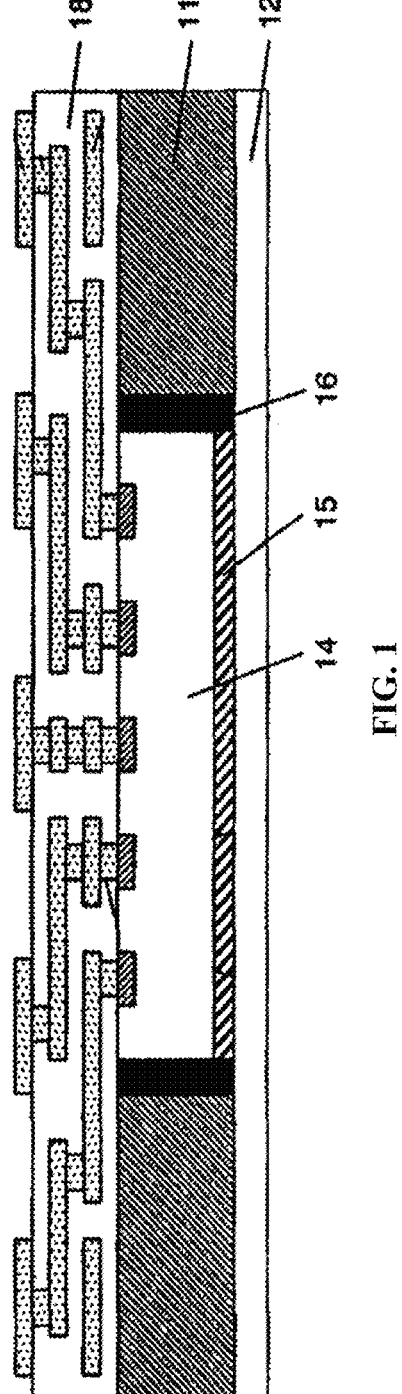
FIG. 1 is a schematic cross-sectional view of a semiconductor device in the prior art.
Figure 2:
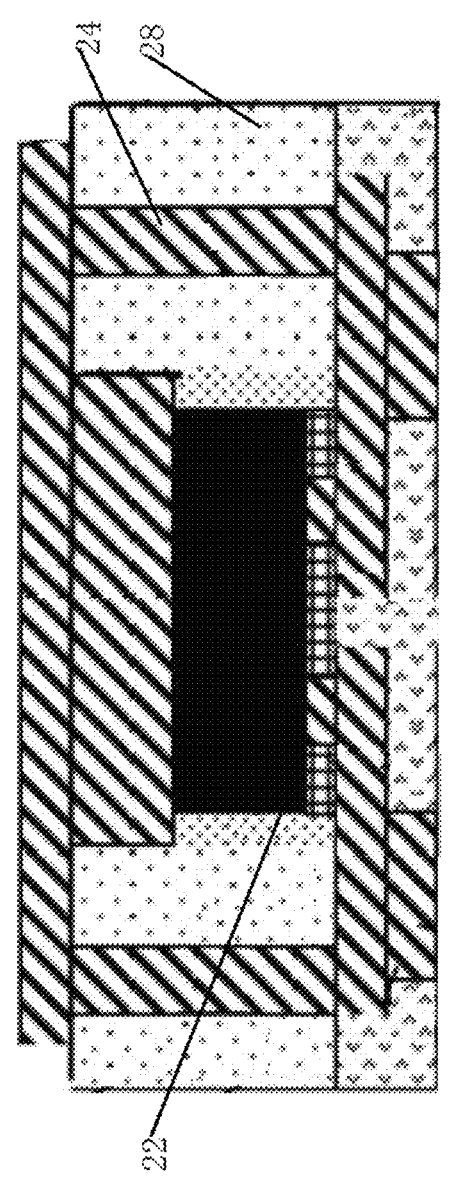
FIG. 2 is a schematic cross-sectional view of an embedded packaging structure of the prior art.
Figure 3:
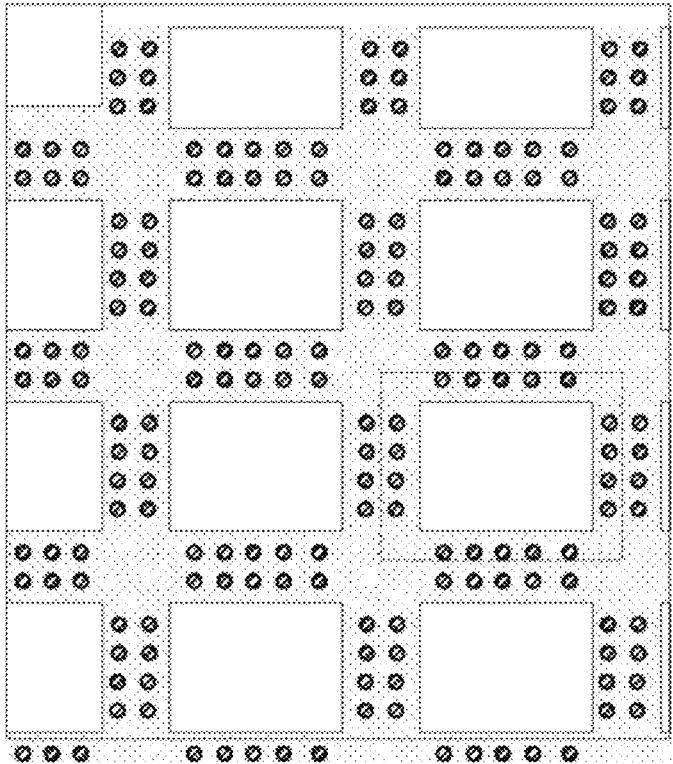
FIG. 3 is a schematic view of a rectangular cavity array polymer frame of the prior art.
Figure 4:
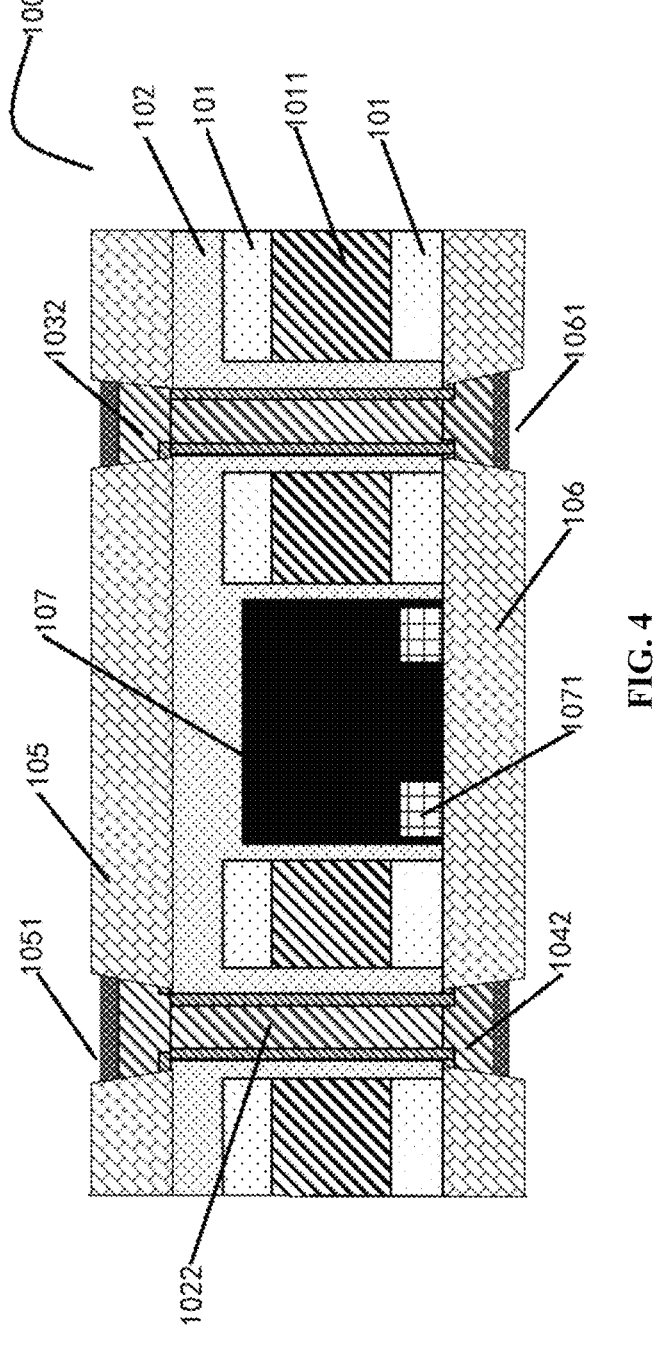
FIG. 4 is a schematic cross-sectional view of a device embedded packaging structure according to one implementation scheme of the present invention.

Referring to FIG. 4, a schematic cross-sectional view of a device embedded packaging structure 100 is shown. The embedded packaging structure 100 includes a second dielectric layer 102, a device 107 embedded within the second dielectric layer 102, and at least one via post 1022 penetrating through the second dielectric layer 102 in the height direction. Generally, the end of the via post 1022 may be flush with the second dielectric layer 102 or may be higher than the second dielectric layer 102; the via post 1022 may serve as an 10 channel for a copper via post. The device 107, which may be an active device or a passive device, is electrically connected to the substrate through a terminal 1071.

The second dielectric layer 102 is covered with copper foil 1011 which is formed with a device opening frame, the first dielectric layer 101 is formed on the upper surface and lower surface of the copper foil 1011, and the device 107 is located in the device opening frame of the copper foil 1011. Generally, the terminal 1071 of the device 107 is flush with the lower surface of the second dielectric layer 102. By presetting the copper foil 1011, the heat dissipation efficiency of the embedded packaging structure can be effectively improved. The first dielectric layer 101 and the second dielectric layer 102 may include the same material or different materials.

A first wiring layer 1032 and a second wiring layer 1042 are respectively formed on the upper surface and lower surface of the second dielectric layer 102, the terminal 1071 of the device 107 is connected to the second wiring layer 1042, and the first wiring layer 1032 and the second wiring layer 1042 are conductively connected through the via post 1022.

As shown in FIG. 4, the device embedded packaging structure 100 further includes a first solder resist layer 105 formed on the first wiring layer 1032 and a second solder resist layer 106 formed on the second wiring layer 1042, a first solder resist window 1051 is provided in the first solder resist layer 105, and a second solder resist window 1061 is provided in the second solder resist layer 106.

Figure 5:
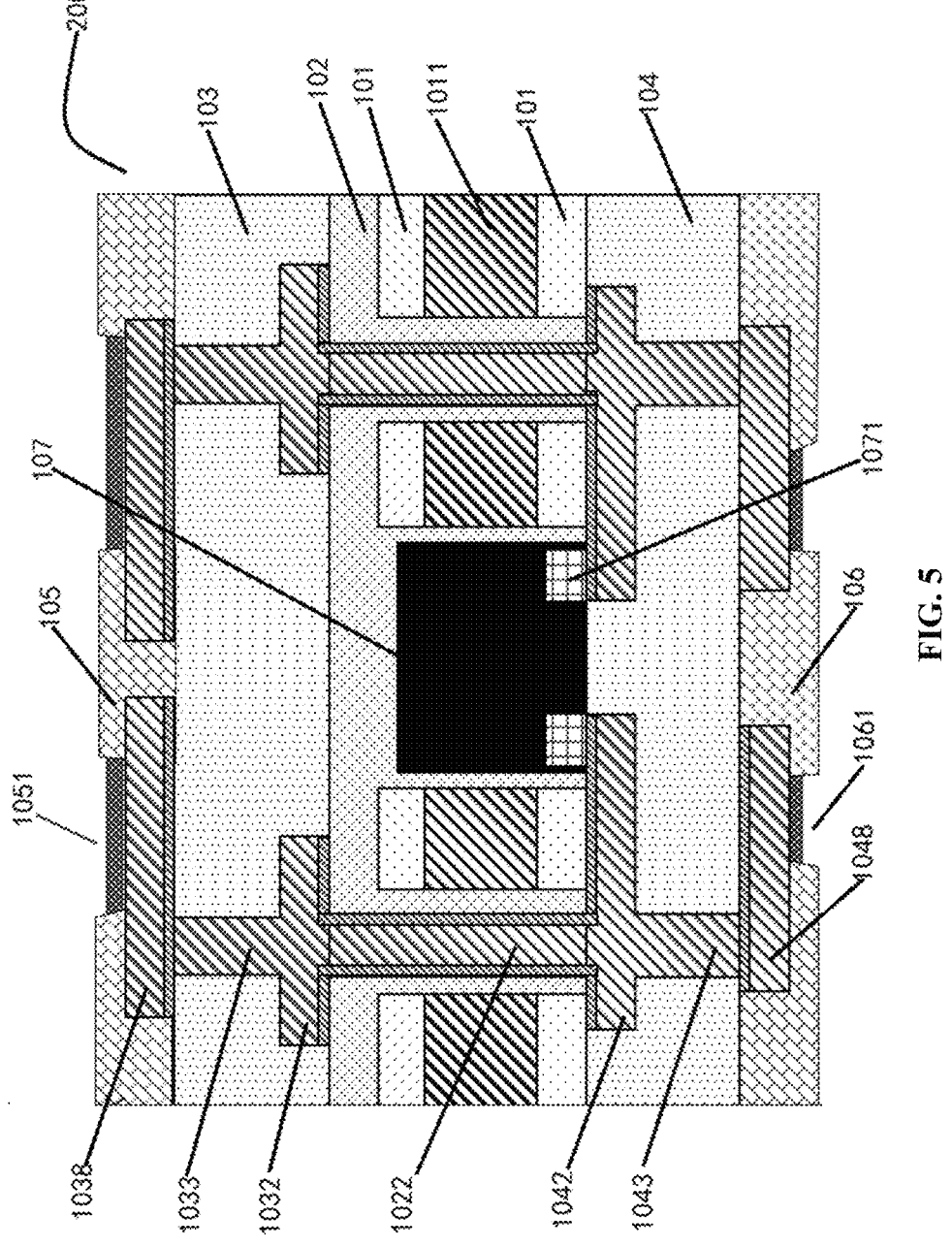
FIG. 5 is a schematic cross-sectional view of a device embedded packaging structure according to another implementation scheme of the present invention.

Referring to FIG. 5, a schematic cross-sectional view of a device embedded packaging structure 200 is shown. The difference between the embedded structure 200 and the embedded structure 100 is that the embedded structure 200 is formed by performing layer-increasing process on the embedded structure 100 to form an additional layer. Specifically, a third dielectric layer 103 is formed on the first wiring layer 1032 and a fourth dielectric layer 104 is formed on the second wiring layer 1042, and the materials of the first dielectric layer 101, the second dielectric layer 102, the third dielectric layer 103, and the fourth dielectric layer 104 may be the same or different. A third wiring layer 1036 is provided outside the third dielectric layer 103, a fourth wiring layer 1046 is provided outside the fourth dielectric layer 104, a first conductive post 1033 is provided inside the third dielectric layer 103, a second conductive post 1043 is provided inside the fourth dielectric layer 104, the first conductive post 1033 conductively connects the first wiring layer 1032 with the third wiring layer 1036, and the second conductive post 1043 conductively connects the second wiring layer 1042 with the fourth wiring layer 1046. The first conductive post 1033 and the second conductive post 1043 may be solid copper posts or hollow copper posts plated with copper at their edges. Therefore, the embedded structure 100 forms the embedded structure 200 through the layer-increasing process.

As shown in FIG. 5, a first solder resist layer 105 can also be formed on the third wiring layer 1036, a second solder resist layer 106 can be formed on the fourth wiring layer 1046, and a first solder resist window 1051 and a second solder resist window 1061 are respectively provided in the first solder resist layer 105 and the second solder resist layer 106.

Figure 6:
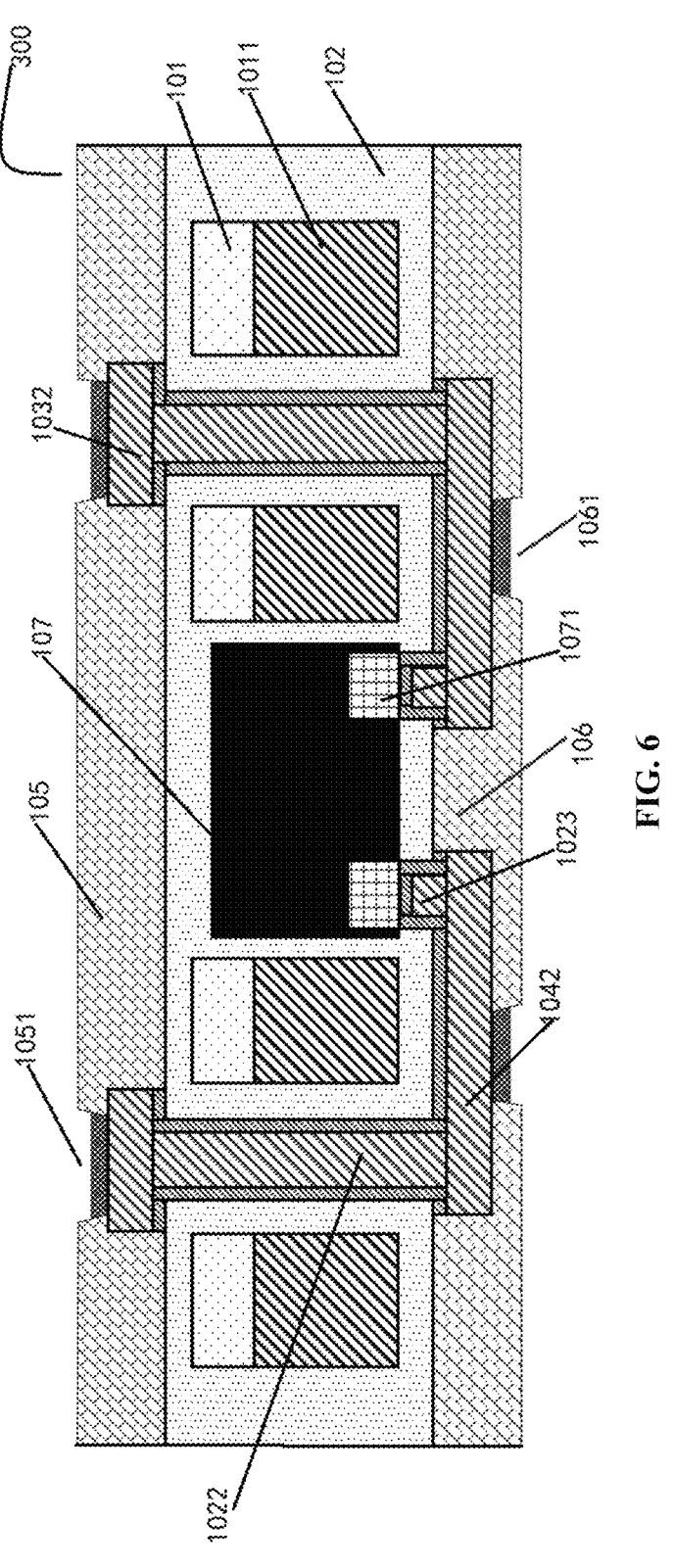
FIG. 6 is a schematic cross-sectional view of a device embedded packaging structure according to another implementation scheme of the present invention.

Referring to FIG. 6, a schematic cross-sectional view of a device embedded packaging structure 300 is shown. The embedded structure 300 differs from the embedded structure 100 in that the first dielectric layer 101 is formed only on the upper surface of the copper foil 1011; the terminal 1071 of the device 107 is embedded in the second dielectric layer 102, and the terminal 1071 of the device 107 is conductively connected to the second wiring layer 1042 through a connecting copper post 1023.

In some embodiments, multiple device opening frames may be formed on the copper foil 1011, multiple devices can be mounted to the copper foil 1011, and the multiple devices are separated by the second dielectric layer 102.

Referring to FIGS. 7A-7L, there are shown schematic cross-sectional views of intermediate structures of various steps of a manufacturing method for the device embedded packaging structure 100 of FIG. 4 and the device embedded packaging structure 200 of FIG. 5.

Figure 7A:
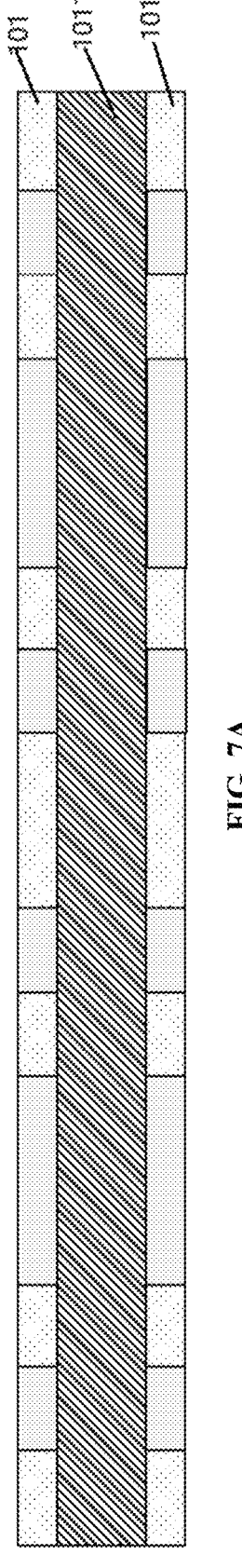
FIGS. 7A-7N show schematic cross-sectional views of intermediate structures at various steps of the manufacturing method for the embedded structure shown in FIGS. 4 and 5.

The manufacturing method includes the steps as follows: the copper foil 1011 after surface super-roughening treatment is prepared; the first dielectric materials are laminated on the upper surface and lower surface of the copper foil 1011, respectively, to form the first dielectric layer 101; a first feature pattern is formed in the first dielectric layer 101—step (a), as shown in FIG. 7A. By super-roughening the surface of the copper foil 1011, the surface area of the copper foil 1011 can be increased to increase the binding force of the copper foil 1011 to the first dielectric layer 101. By presetting the copper foil 1011 within the first dielectric layer 101, the heat dissipation efficiency of the embedded packaging structure can be effectively improved.

Generally, the first dielectric material may include an inorganic filler-reinforced polymer matrix. Preferably, the polymer matrix is selected from a polyimide, an epoxy resin, a bismaleimide triazine resin, a polyphenylene ether, or a combination thereof. Preferably, the inorganic filler is selected from ceramic fillers, glass fibers or combinations thereof. More preferably, the polymer matrix is a photosensitive polymer resin such as a photosensitive polyimide resin or a photosensitive polyphenylene ether resin such as Micro-systems HD-4100, Hitachi PVF-02 and the like.

Generally, when the first dielectric material is a non-photosensitive material, a first feature pattern can be formed in the first dielectric layer 101 by means of plasma etching, laser drilling, or mechanical drilling, etc.; when the first dielectric material is a photosensitive material, the first feature pattern may be formed in the first dielectric layer 101 by means of exposure and development.

Figures 7B, 7C:
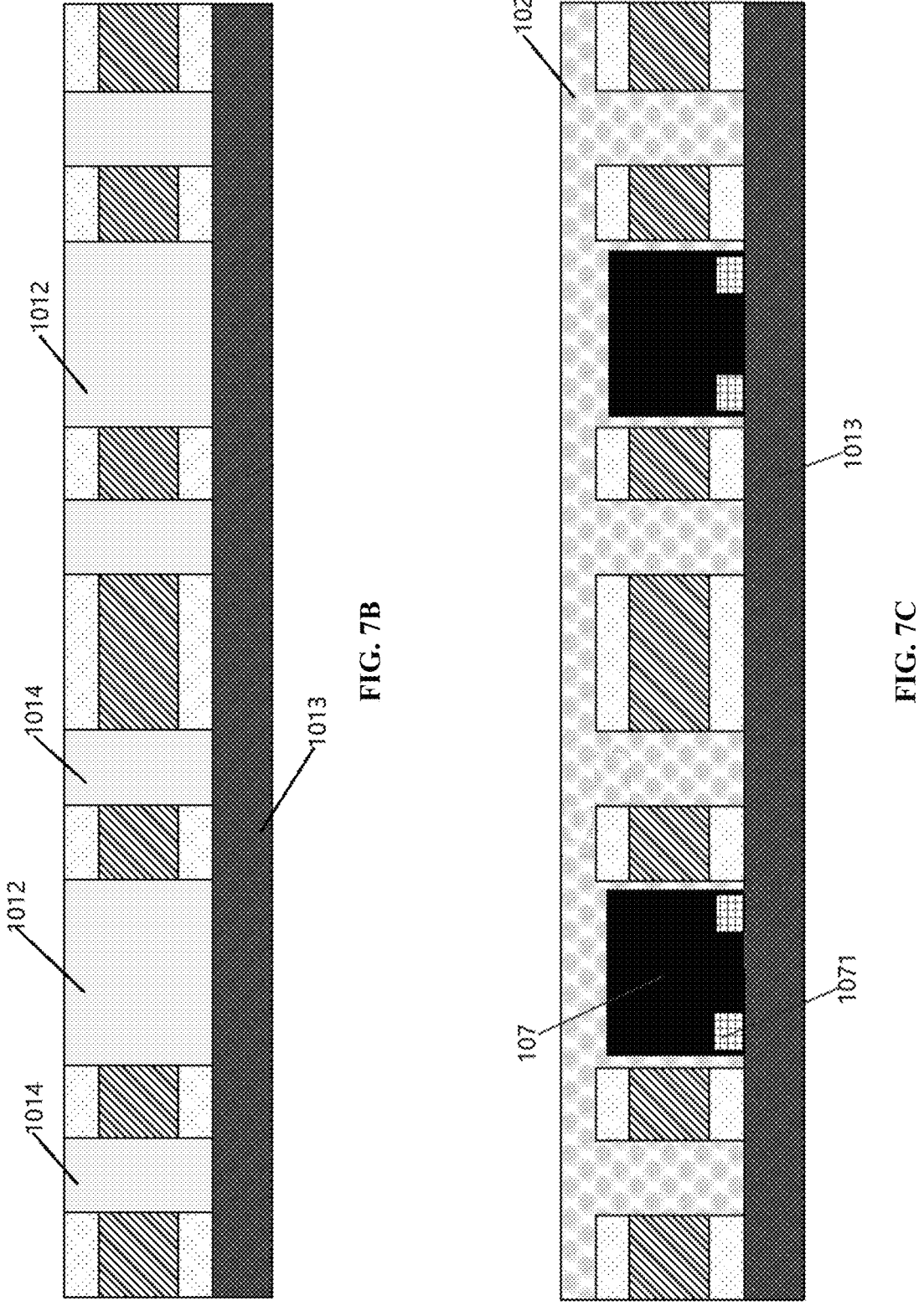

Next, the exposed copper foil 1011 is etched through the first feature pattern to form a device opening frame 1012 and a copper post opening frame 1014, and an adhesive layer 1013 is applied on the bottom surface of the copper foil 1011—step (b), as shown in FIG. 7B. The adhesive layer 1013 is an adhesive tape, generally a commercially available transparent film that can be thermally decomposed or decomposed under ultraviolet radiation. By applying the adhesive layer 1013 on the bottom surface of the copper foil 1011, it is possible to eliminate the need to preset an adhesive layer inside the device opening frame 1012, which solves the problem that the solution of the prior art requires accurate application of an adhesive layer, and each device is at a relatively horizontal reference plane, thus solving the difficulty of layer-increasing conduction caused by subsequent device fluctuations.

The device 107 is then mounted within the device opening frame 1012 and a second dielectric layer 102 is formed by laminating a second dielectric material on the copper foil 1011—step (c), as shown in FIG. 7C. Generally, the upper surface of the second dielectric layer 102 is higher than the upper surface of the first dielectric layer 101. The device 107 can be an active device or a passive device, and the device 107 is electrically connected to the substrate through a terminal 1071; the position of the device 107 may be fixed by attaching the terminal 1071 of the device 107 to the exposed adhesive layer 1013 within the device opening frame 1012. The second dielectric material may include an inorganic filler-reinforced polymer matrix. Preferably, the polymer matrix is selected from a polyimide, an epoxy resin, a bismaleimide triazine resin, a polyphenylene ether, or a combination thereof. Preferably, the inorganic filler is selected from ceramic fillers, glass fibers or combinations thereof. More preferably, the polymer matrix is a photosensitive polymer resin such as a photosensitive polyimide resin or a photosensitive polyphenylene ether resin such as Microsystems HD-4100, Hitachi PVF-02 and the like.

Next, a via pattern is formed at the via post frame of the second dielectric layer 102, and the adhesive layer 1013 is removed-step (d), as shown in FIG. 7D. Generally, when the second dielectric material is a non-photosensitive material, plasma etching, laser drilling, or mechanical drilling, etc. can be used to form a via pattern in the second dielectric layer 102; when the second dielectric material is a photosensitive material, a via pattern may be formed in the second dielectric layer 102 by means of exposure and development. The adhesive layer 1013 can be directly removed by decomposition by heating or ultraviolet light irradiation.

Then, a first metal seed layer 1021 is deposited in the via pattern and on the upper surface and lower surface of the second dielectric layer 102, respectively, copper is electroplated in the via pattern to form the via post 1022, and copper is electroplated on the entire board of the upper surface and lower surface of the second dielectric layer 102 to form the first copper layer 1031 and the second copper layer 1041, respectively-step (e), as shown in FIG. 7E. Generally, the first metal seed layer 1021 can be deposited in the via pattern and on the upper surface and lower surface of the second dielectric layer 102 by means of electroless plating or sputtering; the material of the first metal seed layer 1021 includes titanium, copper, a titanium tungsten alloy, and combinations thereof; the thickness of the first metal seed layer 1021 can be 0.8-5 μm; preferably, the first metal seed layer 1021 is prepared by first sputtering a 0.1 μm titanium layer and then a 1 μm copper layer.

Figure 7F:
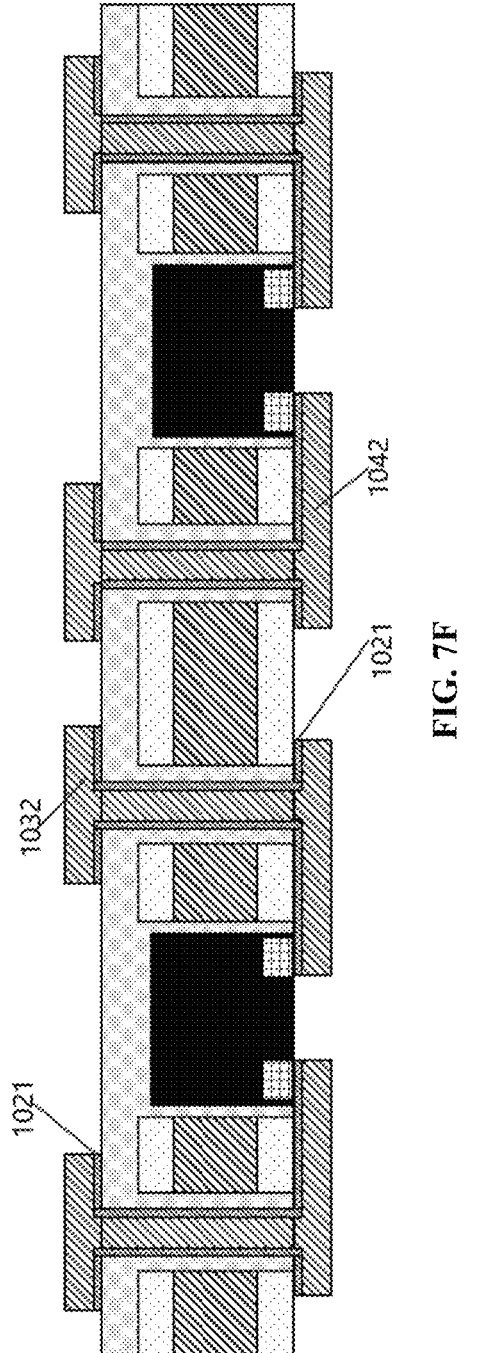

Next, carrying on with step (e), a first photoresist layer and a second photoresist layer are respectively applied on the first copper layer 1031 and the second copper layer 1041, patterning is performed to form a third feature pattern and a fourth feature pattern, and the first copper layer 1031 and the second copper layer 1041 are respectively etched via the third feature pattern and the fourth feature pattern to form a first wiring layer 1032 and a second wiring layer 1042; the first photoresist layer and the second photoresist layer are removed, and the exposed first metal seed layer 1021 is etched-step (f), as shown in FIG. 7F. In general, the photoresist layer can be patterned by exposure and development to form a feature pattern according to actual needs.

Figure 7G:
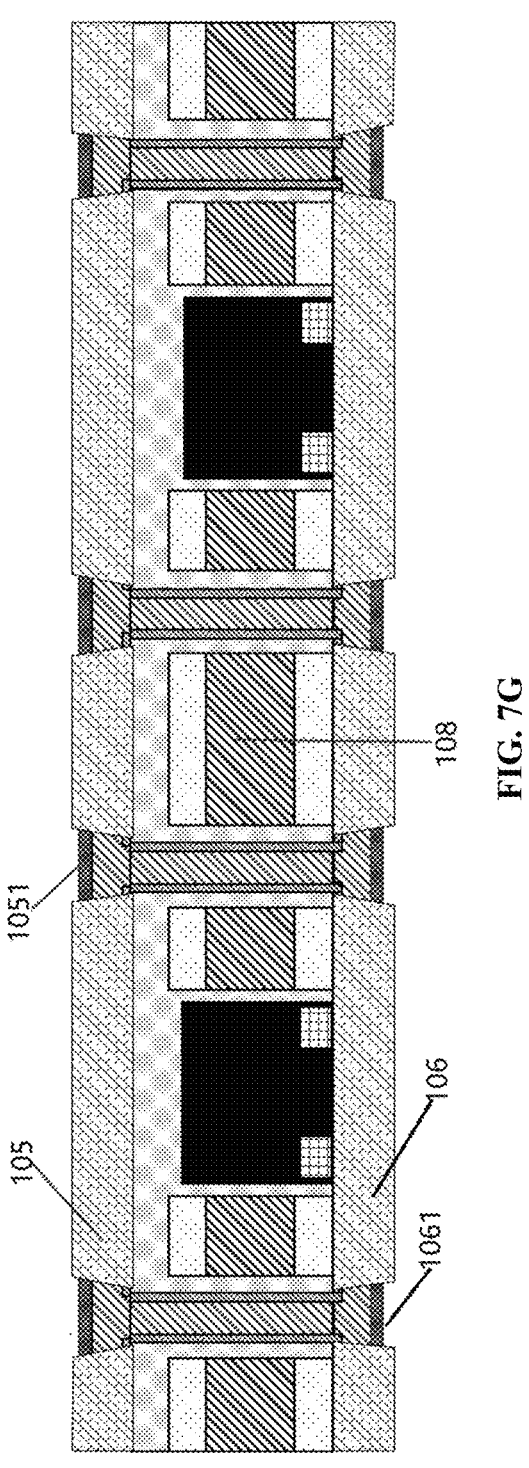

Then, a first solder resist layer 105 and a second solder resist layer 106 are applied on the first wiring layer 1032 and the second wiring layer 1042, respectively, and the exposed metal surfaces are treated respectively to form a first solder resist window 1051 and a second solder resist window 1061—step (g), as shown in FIG. 7G. Generally, the solder resist layer can be made by first solder resist screen-printing and then exposure and development; the metal surface treatment is carried out by means of chemical nickel-palladium-gold or OSP.

Figure 7H:
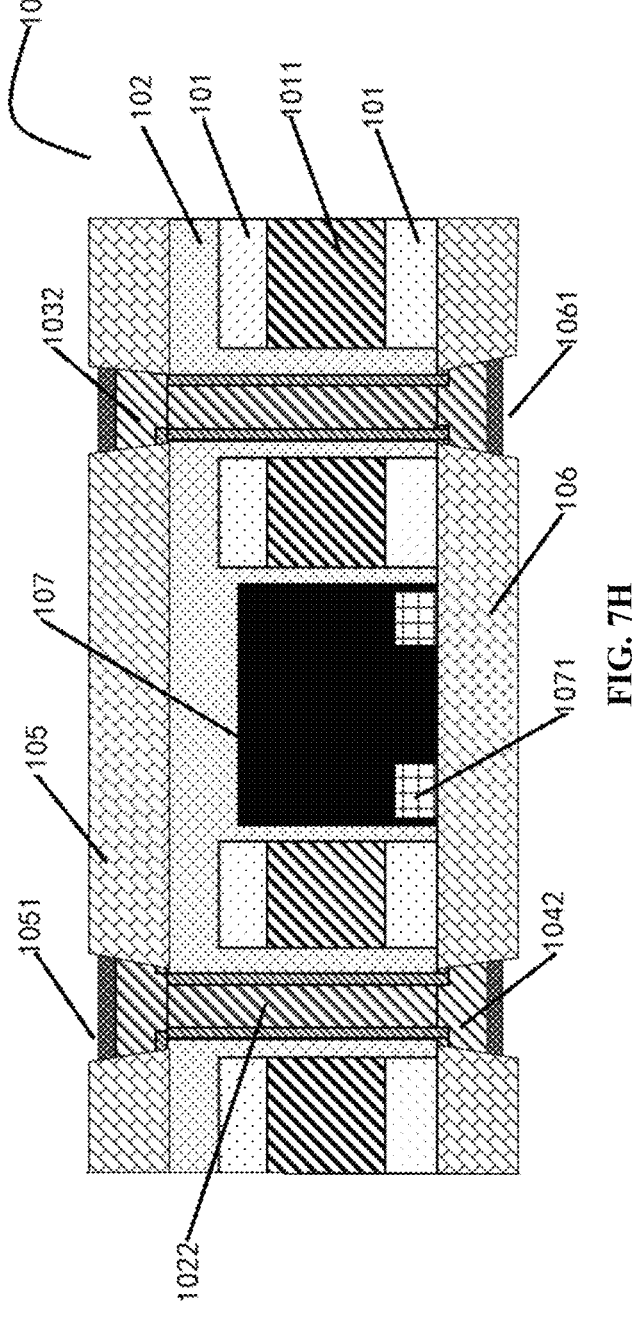

Next, product dicing is performed along the dicing channel 108 at the unit dicing area to obtain a device embedded packaging structure unit-step (h), as shown in FIG. 7H.

Figure 7I:
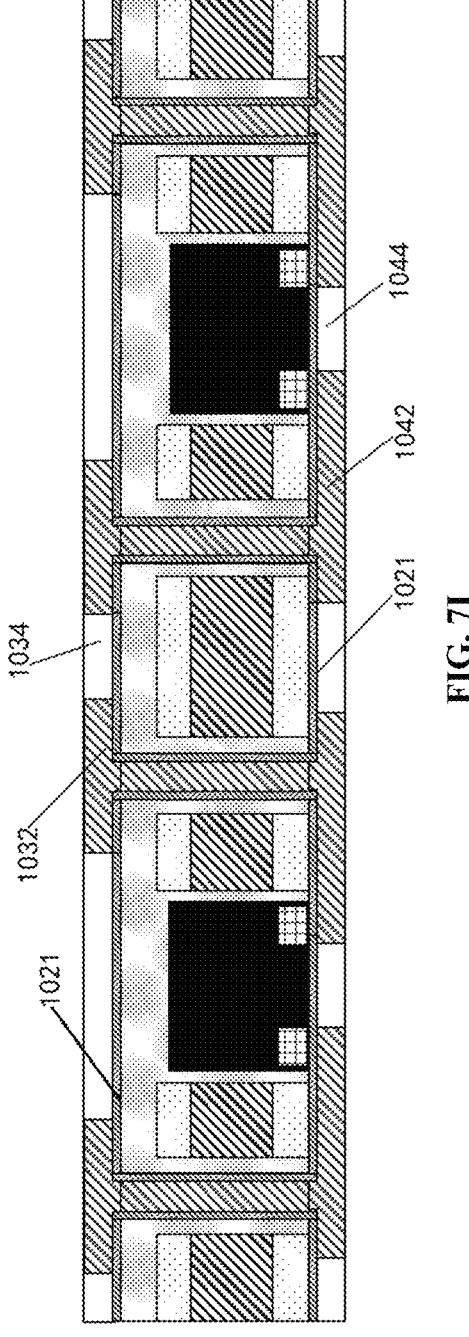

Then, carrying on with step (e), a first photoresist layer 1034 and a second photoresist layer 1044 are respectively applied on the first copper layer 1031 and the second copper layer 1041, patterning is performed to form a third feature pattern and a fourth feature pattern, and the first copper layer 1031 and the second copper layer 1041 are respectively etched via the third feature pattern and the fourth feature pattern to form a first wiring layer 1032 and a second wiring layer 1042—step (i), as shown in FIG. 7I.

Figure 7J:
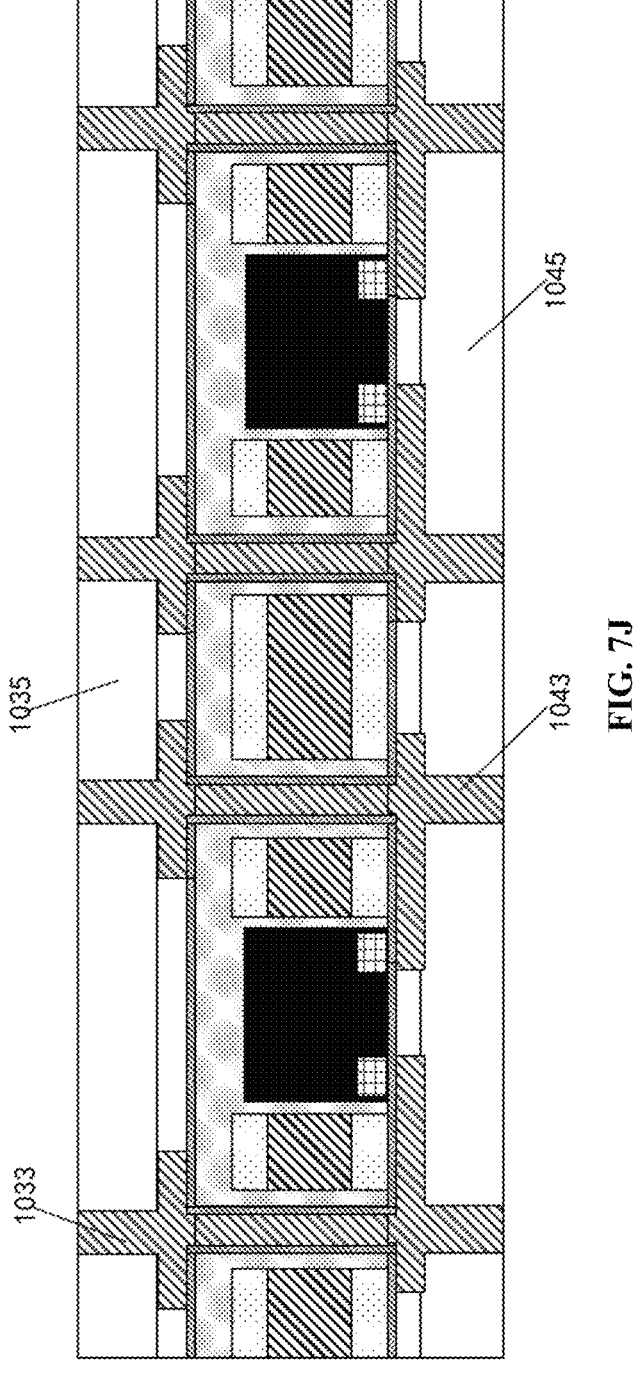

Next, a third photoresist layer 1035 and a fourth photoresist layer 1045 are applied on the first wiring layer 1032 and the second wiring layer 1042, respectively, patterning is performed to form a fifth feature pattern and a sixth feature pattern, and the fifth feature pattern and the sixth feature pattern are plated to form a first via post 1033 and a second via post 1043, respectively-step (j), as shown in FIG. 7J.

Figure 7K:
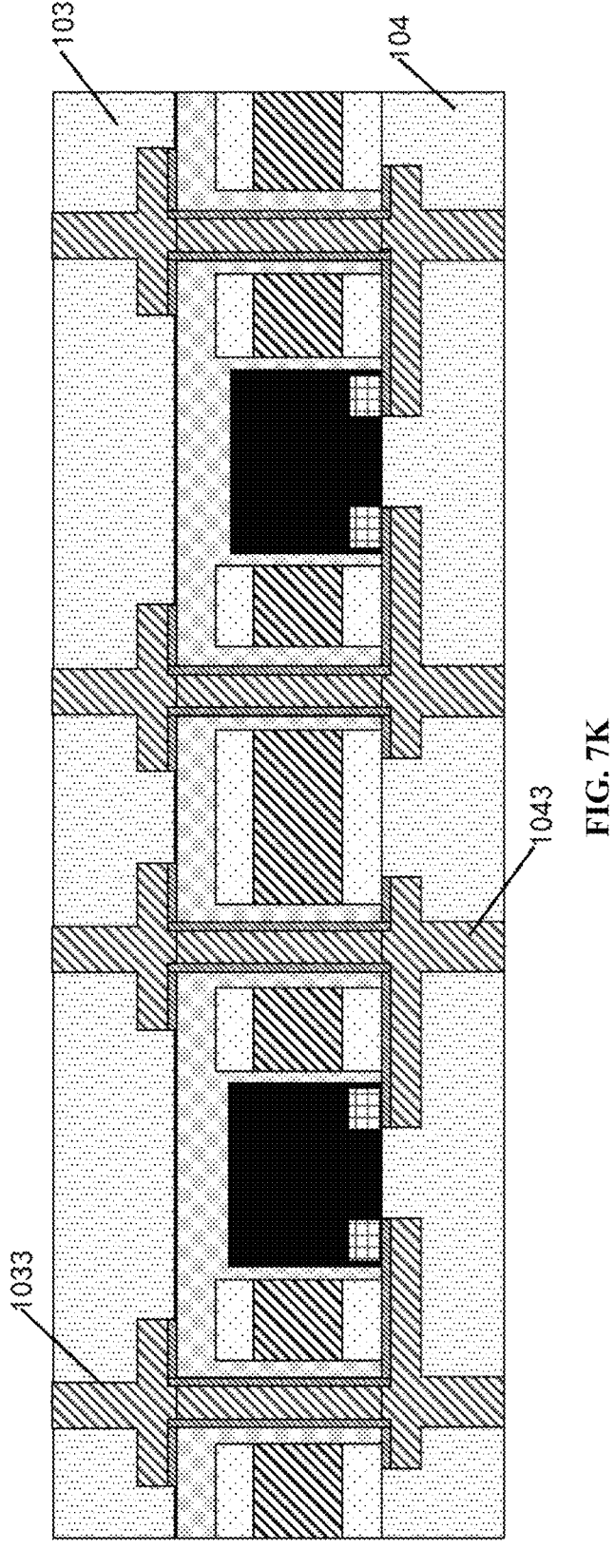

Then, the first photoresist layer 1034, the second photoresist layer 1044, the third photoresist layer 1035, and the fourth photoresist layer 1045 are removed, the exposed first metal seed layer 1021 is etched, and a third dielectric material is laminated on the first wiring layer 1032 and the second wiring layer 1042 respectively to form a third dielectric layer 103 and a fourth dielectric layer 104; the thinning of the third dielectric layer 103 and the fourth dielectric layer 104 exposes the ends of the first via post 1033 and the second via post 1043—step (k), as shown in FIG. 7K. Generally, the third dielectric material may include an inorganic filler-reinforced polymer matrix. Preferably, the polymer matrix is selected from a polyimide, an epoxy resin, a bismaleimide triazine resin, a polyphenylene ether, or a combination thereof. Preferably, the inorganic filler is selected from ceramic fillers, glass fibers or combinations thereof. More preferably, the polymer matrix is a photosensitive polymer resin such as a photosensitive polyimide resin or a photosensitive polyphenylene ether resin such as Microsystems HD-4100, Hitachi PVF-02 and the like. When the third dielectric material is a non-photosensitive material, a via can be formed in the third dielectric layer 103 and the fourth dielectric layer 104 by means of plasma etching, laser drilling, or mechanical drilling, etc.; when the third dielectric material is a photosensitive material, a via can be formed in the third dielectric layer 103 and the fourth dielectric layer 104 by means of exposure and development.

Figure 7L:
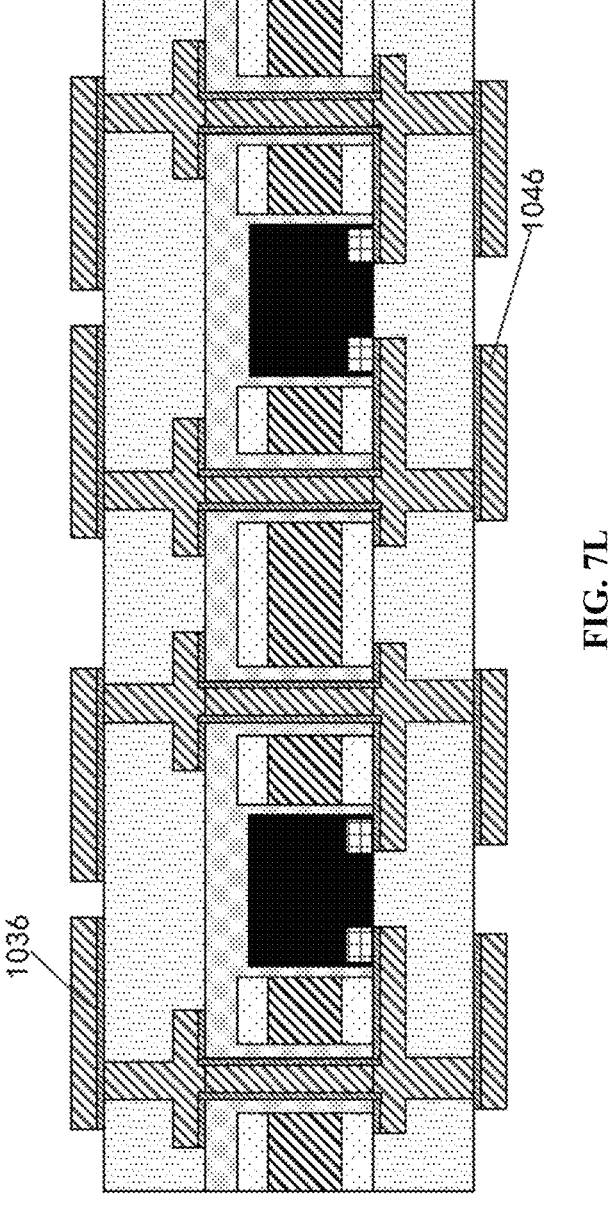

Next, a third wiring layer 1036 and a fourth wiring layer 1046 are prepared on the surfaces of the third dielectric layer 103 and the fourth dielectric layer 104, respectively—step (1), as shown in FIG. 7L. Generally, the following sub-steps are included:

depositing a second metal seed layer and a third metal seed layer on the surfaces of the third dielectric layer and the fourth dielectric layer, respectively;

electroplating copper on the entire board of the second metal seed layer and the third metal seed layer respectively to form a third copper layer and a fourth copper layer;

applying a fifth photoresist and a sixth photoresist respectively outside the third copper layer and the fourth copper layer;

respectively patterning the fifth photoresist and the sixth photoresist to form a seventh feature pattern and an eighth feature pattern;

forming a third wiring layer 1036 and a fourth wiring layer 1046 by etching a third copper layer and a fourth copper layer respectively via a seventh feature pattern and an eighth feature pattern; and

removing the fifth photoresist and sixth photoresist layer, and etching away the second metal seed layer and the third metal seed layer.

Generally, the second metal seed layer and the third metal seed layer can be made by means of electroless plating or sputtering; the second metal seed layer and/or the third metal seed layer can include titanium, copper, a titanium tungsten alloy, or a combination thereof; the thickness of the second metal seed layer and/or the third metal seed layer may be from 0.8 μm to 5 μm; preferably, and the second metal seed layer and the third metal seed layer are prepared by first sputtering a titanium layer of the thickness of 0.1 μm and then sputtering a 1 μm copper layer.

Figure 7M:
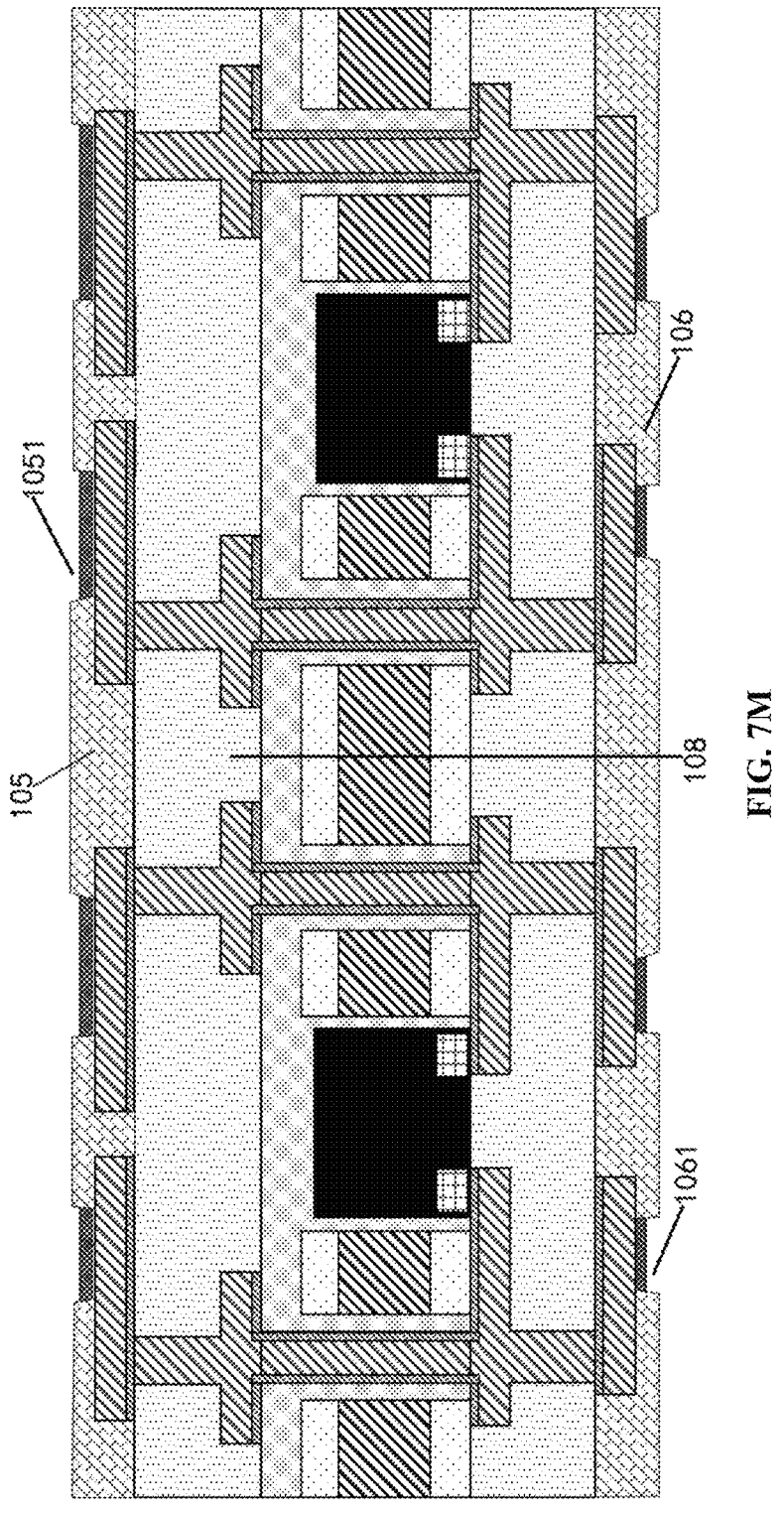

Then, a first solder resist layer 105 and a second solder resist layer 106 are applied to the third wiring layer 1036 and the fourth wiring layer 1046, respectively, and the exposed metal surface is treated to form a first solder resist window 1051 and a second solder resist window 1061, respectively-step (m), as shown in FIG. 7M.

Figure 7N:
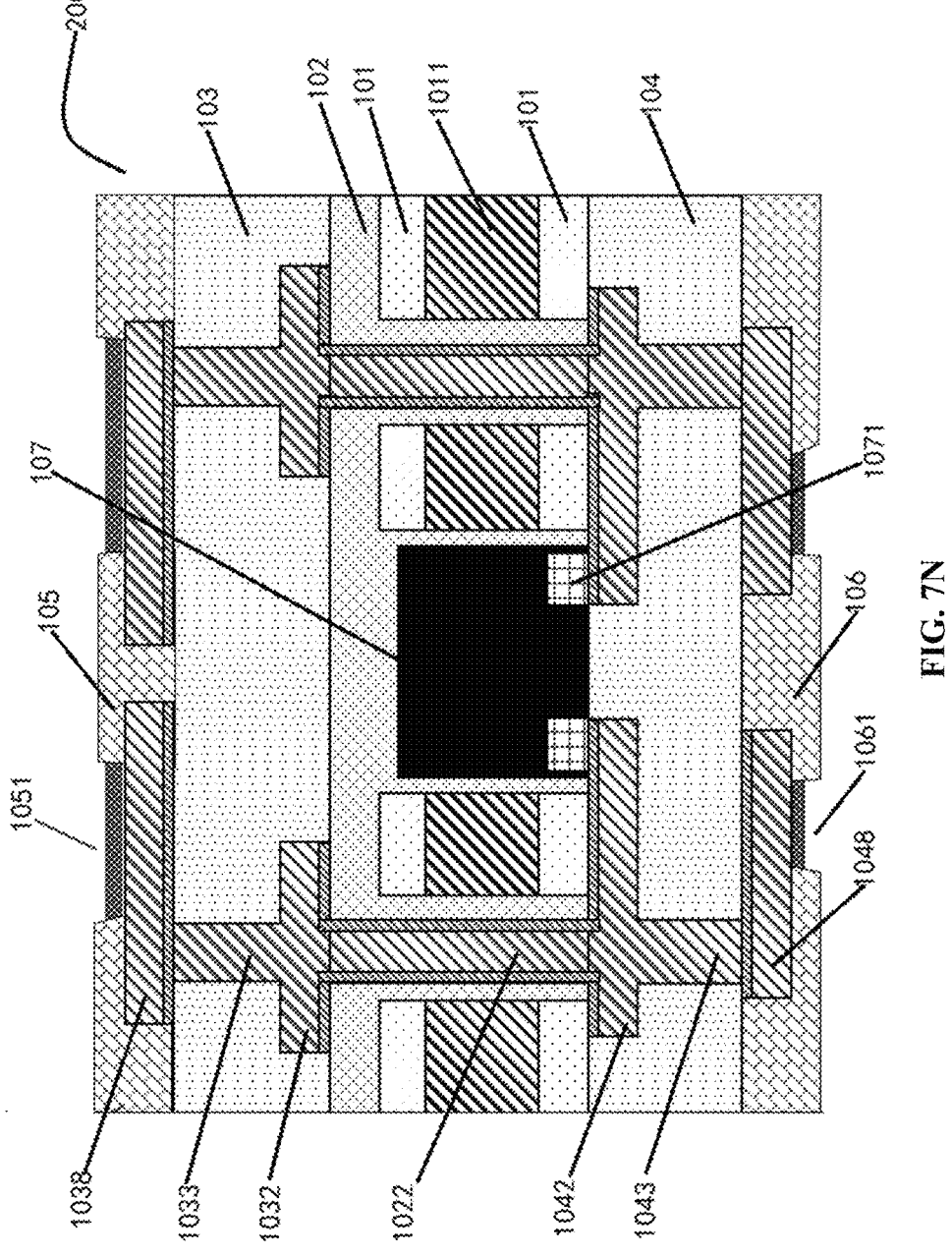

Finally, product dicing is performed along a dicing channel 108 at the unit dicing area to obtain an embedded structure unit with the device terminal facing downwards-step (n), as shown in FIG. 7N.

Referring to FIGS. 8A-8J, there are shown schematic cross-sectional views of intermediate structures of various steps of a manufacturing method for the device embedded packaging structure 300 of FIG. 6.

Figures 8A, 8B:
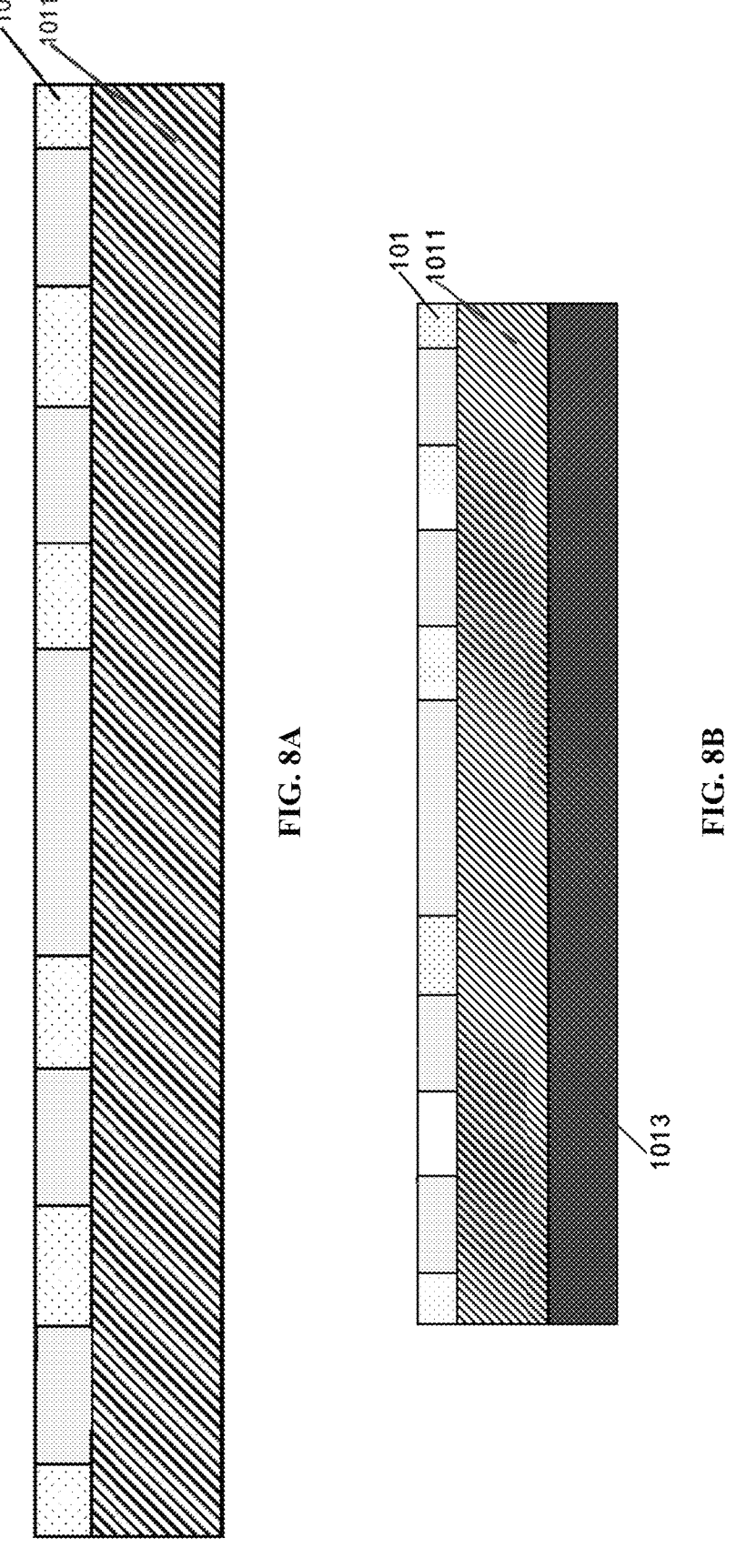
FIGS. 8A-8J show schematic cross-sectional views of intermediate structures at various steps of the manufacturing method for the embedded structure shown in FIG. 6.

The manufacturing method includes the steps as follows: the copper foil 1011 after surface super-roughening treatment is prepared; the first dielectric materials are laminated on the upper surface of the copper foil 1011, respectively to form the first dielectric layer 101; a first feature pattern is formed in the first dielectric layer 1011—step (a), as shown in FIG. 8A.

Next, an adhesive layer 1013 is applied on the lower surface of the copper foil 1011—step (b), as shown in FIG. 8B.

Figure 8C:
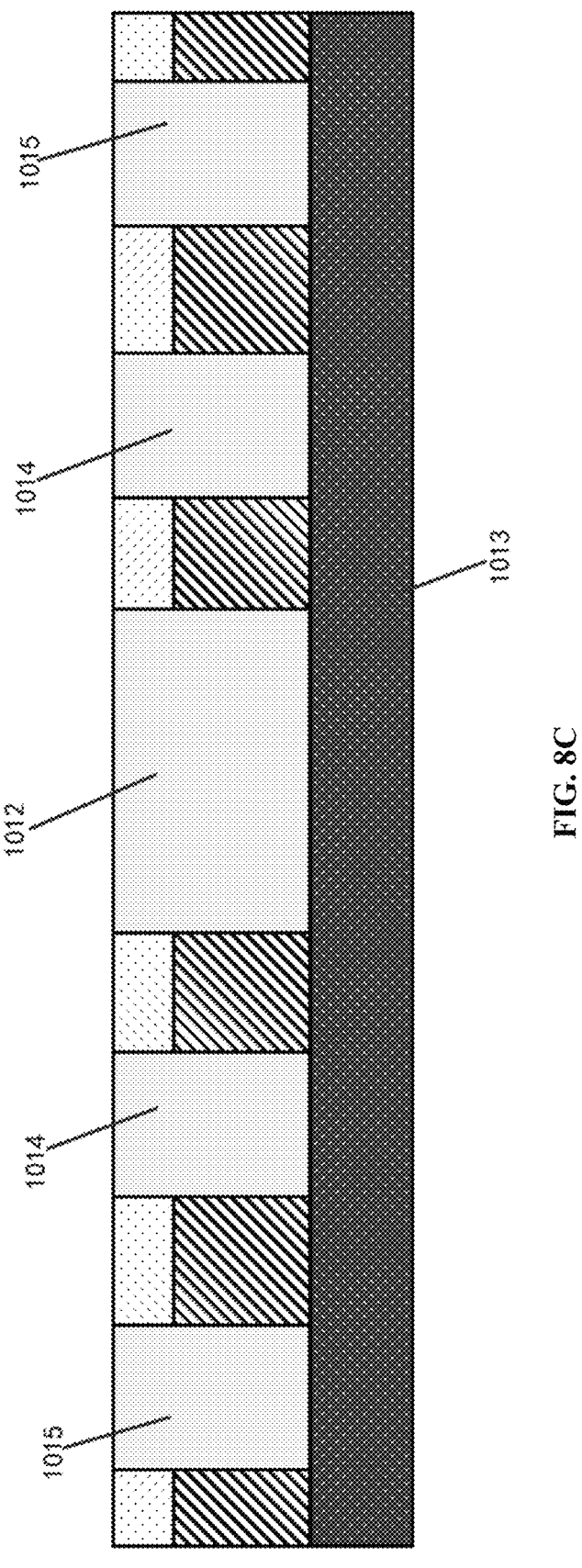

Then, the copper foil 1011 exposed by the first feature pattern is etched to form a device opening frame 1012, a via post opening frame 1014, and a cutting channel opening frame 1015—step (c), as shown in FIG. 8C. Generally, a via post opening frame 1014 is used for subsequent preparation of the via post and a cutting channel opening frame 1015 is used for subsequent processing to divide the units.

Figure 8D:
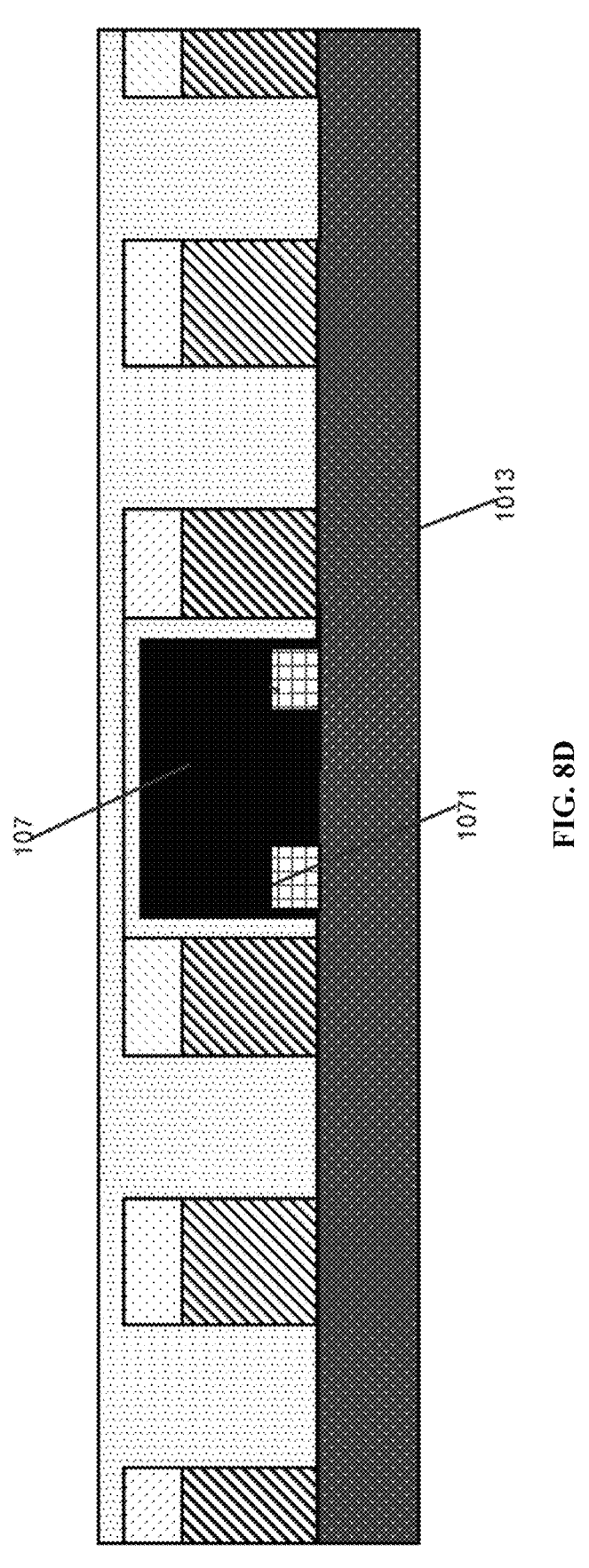

Next, the device 107 is mounted within the device opening frame 1012 and a second dielectric material is laminated over the copper foil 1011—step (d), as shown in FIG. 8D. Generally, the position of the device 107 may be fixed by attaching the terminal 1071 of the device 107 to the exposed adhesive layer 1013 within the device opening frame 1012. The upper surface of the second dielectric material is higher than the upper surface of the first dielectric layer 101.

Figures 8E, 8F:
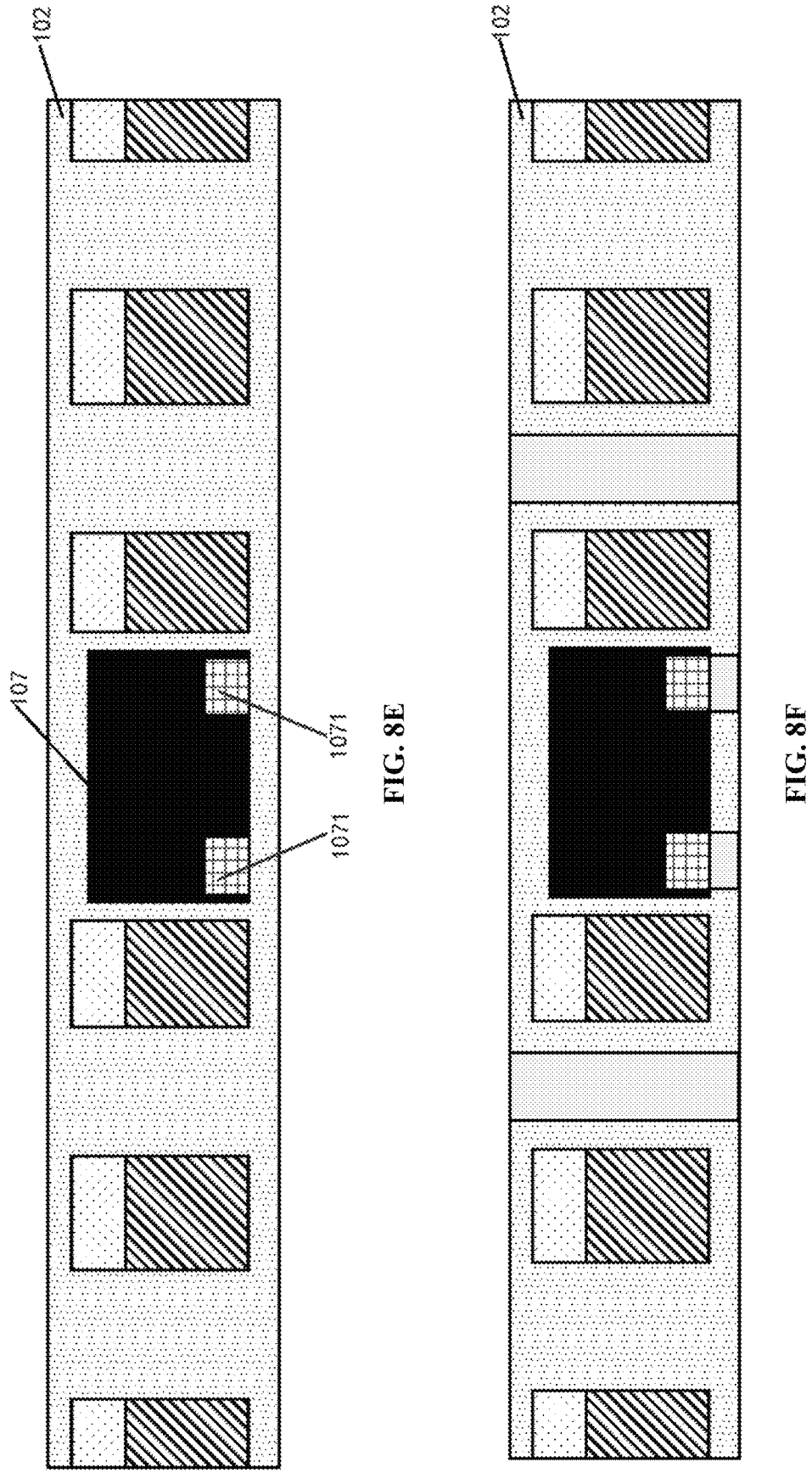

Then, the adhesive layer 1013 is removed, and the second dielectric material is laminated under the copper foil 1011 to form a second dielectric layer 102—step (e), as shown in FIG. 8E. Generally, the lower surface of the second dielectric material extends beyond the lower surface of the device 107, and the copper foil 1011 and the first dielectric layer 101 on the upper surface of the copper foil 1011 are completely embedded within the second dielectric layer 102.

Next, a via pattern is formed in the second dielectric layer 102—step (f), as shown in FIG. 8F.

Figure 8G:
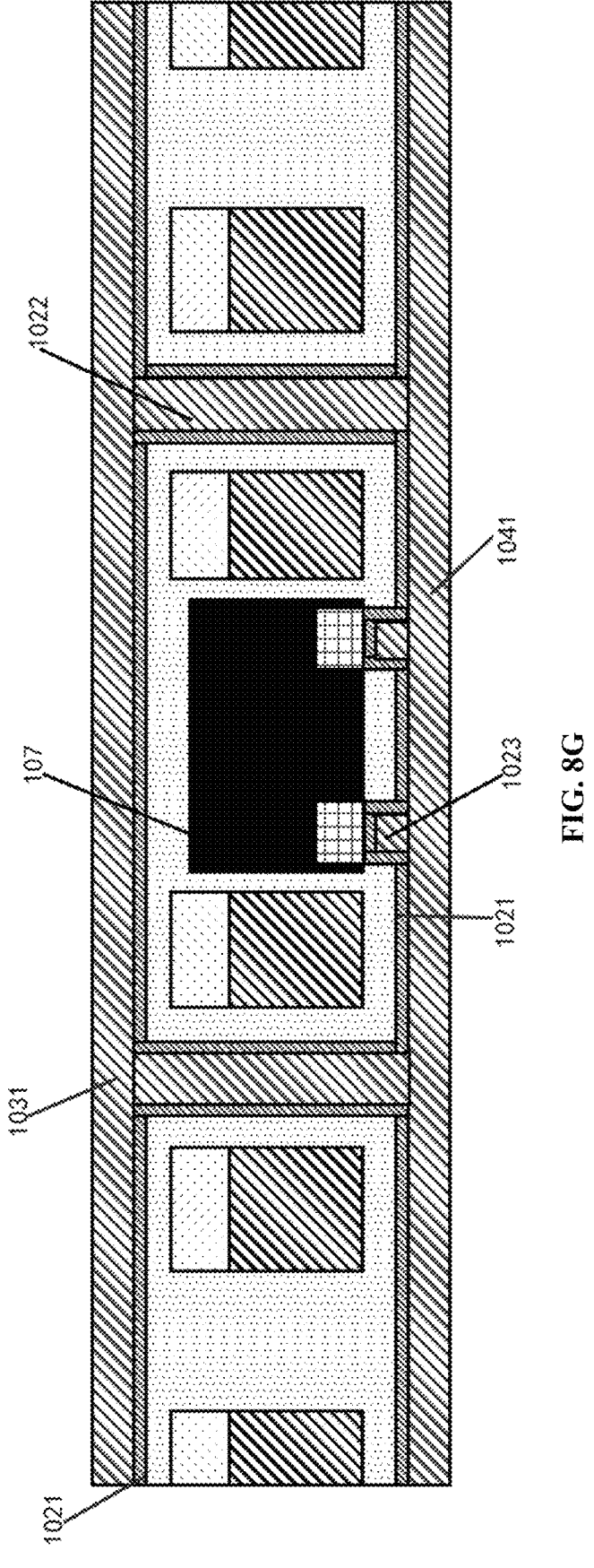

Then, a first metal seed layer 1021 is deposited in the via pattern and on the upper surface and lower surface of the second dielectric layer 102, respectively, copper is electroplated in the via pattern to form via post 1022 and connecting copper post 1023, and copper is electroplated on the entire board of the upper surface and lower surface of the second dielectric layer 102 respectively to form a first copper layer 1031 and a second copper layer 1041—step (g), as shown in FIG. 8G. The connecting copper post 1023 is for the conductive connection of the terminal 1071 of the device 107 to the second wiring layer in a subsequent process.

Figure 8H:
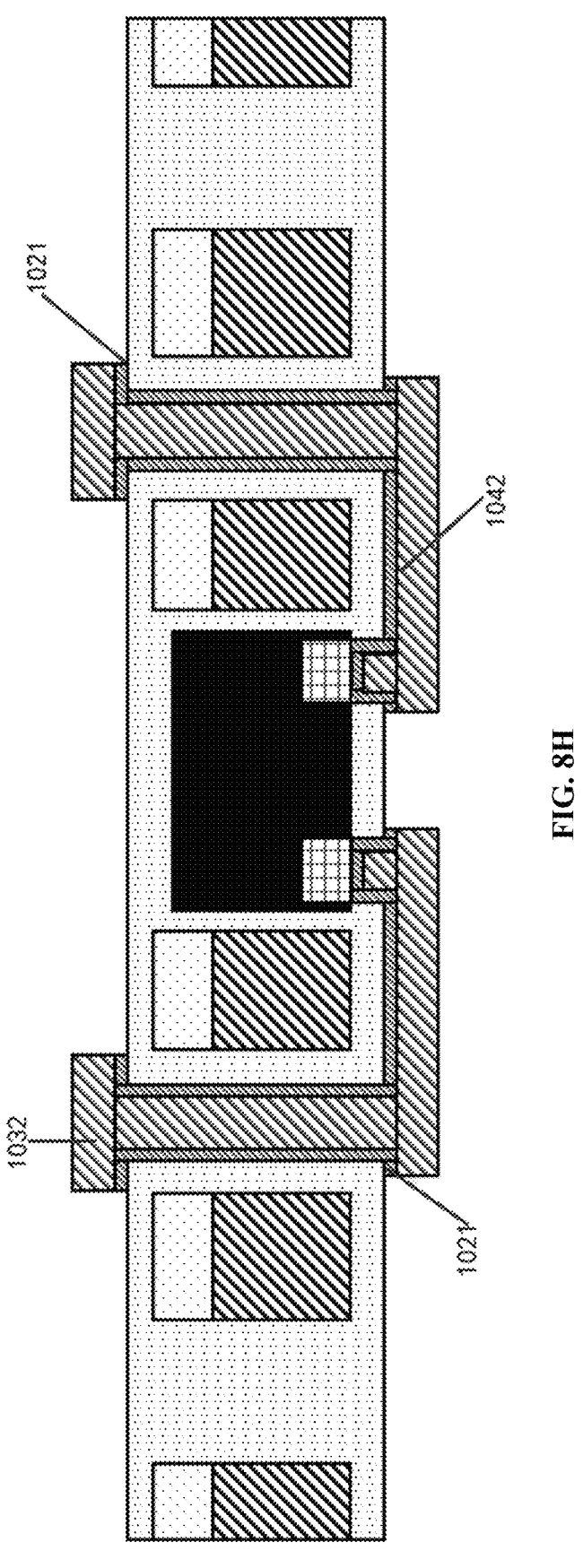

Next, applying a first photoresist layer and a second photoresist layer on the first copper layer 1031 and the second copper layer 1041, respectively, performing patterning on the first photoresist layer and the second photoresist layer to form a third feature pattern and a fourth feature pattern, respectively, and etching the first copper layer 1031 and the second copper layer 1041 through the third feature pattern and the fourth feature pattern to form a first wiring layer 1032 and a second wiring layer 1042; removing the first photoresist layer and the second photoresist layer, and etching the exposed first metal seed layer 1021—step (h), as shown in FIG. 8H.

Figure 8I:
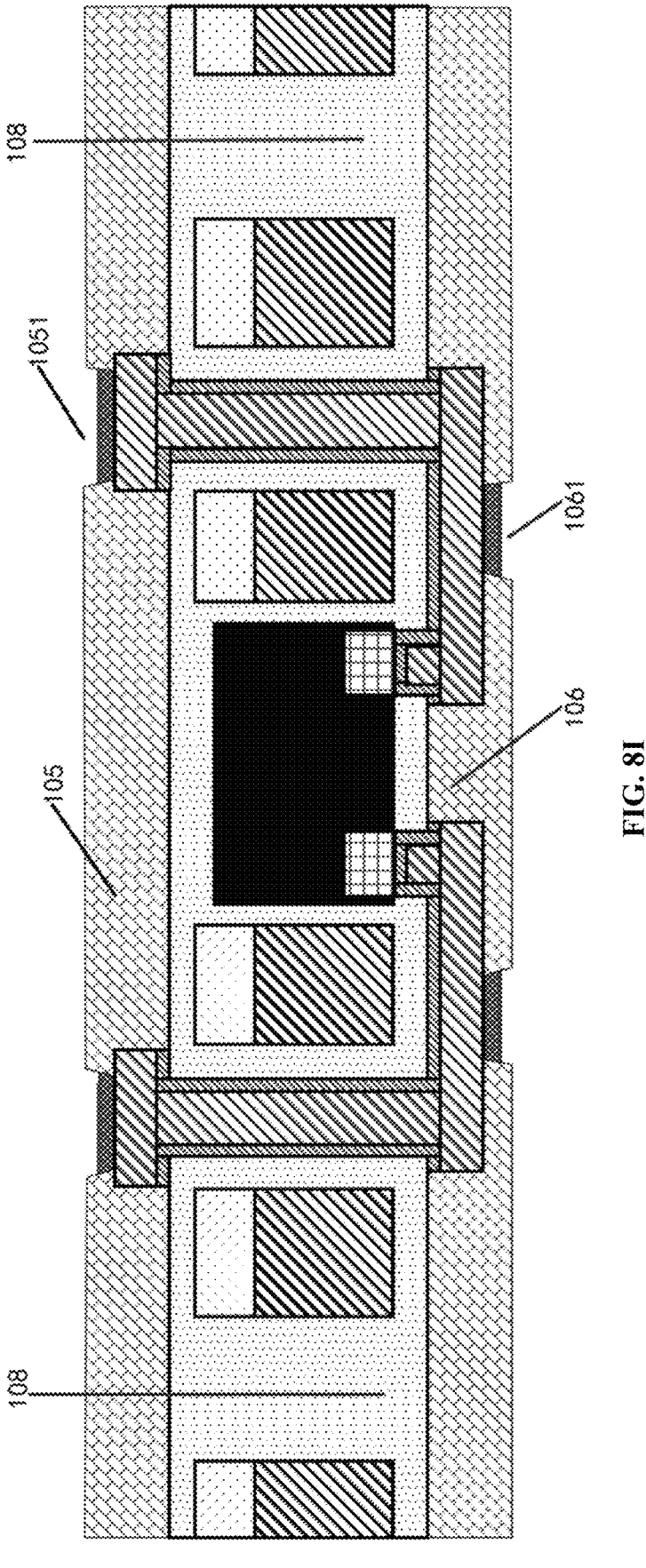

Then, a first solder resist layer 105 and a second solder resist layer 106 are applied on the first wiring layer 1032 and the second wiring layer 1042, respectively, and the exposed metal surfaces are treated respectively to form a first solder resist window 1051 and a second solder resist window 1061—step (i), as shown in FIG. 8I.

Figure 8J:
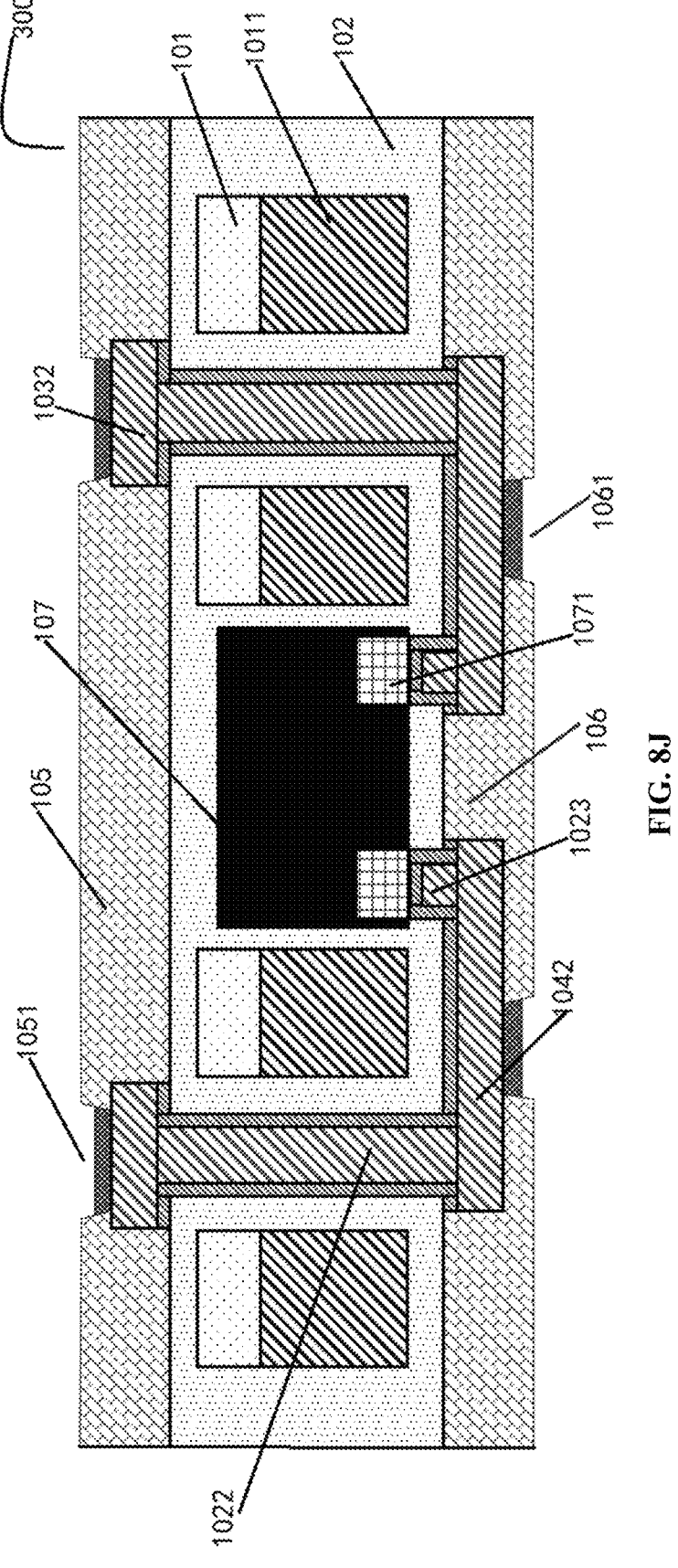

Finally, product dicing is performed along a dicing channel 108 at the unit dicing area to obtain an embedded structure unit with the device terminal facing downwards-step (j), as shown in FIG. 8J.

It should be understood that the product is in a grid-like arrangement, and includes multiple units with multiple devices, and can be divided into several units after cutting. The above-mentioned flow is merely used as a demonstration method, and the combination within each unit can be any combination according to actual needs. For example, it can include multiple devices. Furthermore, the structure is not limited to two layers, and layer-increasing can be implemented according to actual needs, and more than one additional layer structure can be designed to be added according to actual needs. The additional layer may include a dielectric layer and a wiring layer.

It will be appreciated by persons skilled in the art that the present invention is not limited by what has been particularly shown and described herein. Rather, the scope of the present invention is defined by the appended claims, including both combinations and sub-combinations of the various technical features described hereinabove, as well as variations and modifications thereof, which would occur to persons skilled in the art upon reading the foregoing description.

In the claims, the term "comprises" and variations thereof such as "includes", "comprising" and the like mean that the recited assembly is included, but not generally excluding other assemblies.

What is claimed is:

1. A method for manufacturing a device embedded packaging structure, the method comprising:
    laminating a first dielectric material on a top surface of a copper foil to form a first dielectric layer, and forming a first feature pattern in the first dielectric layer to expose the copper foil;
    etching an exposed copper foil to form a device opening frame and a via post opening frame so as to obtain a metal frame having the first dielectric layer;
    applying an adhesive layer on a bottom surface of the metal frame, and mounting a device on the adhesive layer in the device opening frame, wherein a terminal of the device is attached on the adhesive layer;

laminating a second dielectric material to form a second dielectric layer, wherein the second dielectric layer covers the first dielectric layer and fills the device opening frame and the via post opening frame, and then removing the adhesive layer to expose the terminal of the device; and forming a via post in the via post opening frame, and forming a first wiring layer on an upper surface of the second dielectric layer and a second wiring layer on the bottom surface of the metal frame, wherein the terminal of the device is connected with the second wiring layer, and the first wiring layer and the second wiring layer are conductively connected by the via post.

2. The manufacturing method according to claim 1, wherein the first dielectric material and the second dielectric material are the same or different.

3. The manufacturing method according to claim 2, wherein the first dielectric material and/or the second dielectric material comprises an inorganic filler reinforced polymer matrix.

4. The manufacturing method according to claim 3, wherein the polymer matrix is selected from polyimide, epoxy resin, bismaleimide triazine resin, polyphenylene ether, or a combination thereof.

5. The manufacturing method according to claim 3, wherein the inorganic filler is selected from a ceramic filler, a glass fiber, or a combination thereof.

6. The manufacturing method according to claim 3, wherein the polymer matrix is a photosensitive polymer resin.

7. The manufacturing method according to claim 1, wherein the laminating of the first dielectric material comprises roughening a surface of the copper foil.

8. The manufacturing method according to claim 1, wherein the laminating of the first dielectric material comprises forming a first feature pattern in the first dielectric layer by means of laser drilling, mechanical drilling, plasma etching, or exposure and development.

9. The manufacturing method according to claim 1, wherein the adhesive layer comprises an adhesive tape.

10. The manufacturing method according to claim 1, wherein the applying of the adhesive layer comprises attaching a terminal surface of the device onto the adhesive layer in the device opening frame.

11. The manufacturing method according to claim 10, wherein the laminating of the second dielectric material further comprises removing the adhesive layer after laminating the second dielectric material on a top surface of the metal frame to form the second dielectric layer.

12. The manufacturing method according to claim 11, wherein the laminating of the second dielectric material further comprises:

after removing the adhesive layer, laminating the second dielectric material on the bottom surface of the metal frame to form the second dielectric layer.

13. The manufacturing method according to claim 1, wherein the forming of the via post comprises:

forming a via in the via post opening frame;

depositing a first metal seed layer in the via and on the upper surface and the lower surface of the second dielectric layer;

electroplating copper on the first metal seed layer, forming a via post in the via, and respectively forming a first copper layer and a second copper layer on the upper surface and the lower surface of the second dielectric layer;

etching the first copper layer and the second copper layer to respectively form the first wiring layer and the second wiring layer; and etching the exposed first metal seed layer.

14. The manufacturing method according to claim 13, wherein the etching of the first copper layer and the second copper layer further comprises:

respectively applying a first photoresist layer and a second photoresist layer on the first copper layer and the second copper layer, and patterning the first photoresist layer and the second photoresist layer to expose the first copper layer and the second copper layer;

respectively etching exposed first copper layer and second copper layer to form the first wiring layer and the second wiring layer; and removing the first photoresist layer and the second photoresist layer.

15. The manufacturing method according to claim 13, wherein the first metal seed layer is deposited by means of electroless plating or sputtering.

16. The manufacturing method according to claim 15, wherein the first metal seed layer comprises titanium, copper, titanium tungsten alloy, or a combination thereof.

17. The manufacturing method according to claim 1, further comprising applying a first solder resist layer and a second solder resist layer on the first wiring layer and the second wiring layer, respectively, and treating an exposed metal surface to form a solder resist window.

18. The manufacturing method according to claim 1, further comprising:

performing layer-increasing process on the first wiring layer and/or the second wiring layer to form an additional layer so as to form a multilayer interconnected structure.

19. The manufacturing method according to claim 18, wherein the additional layer comprises a dielectric layer and a wiring layer.

20. The manufacturing method according to claim 19, wherein the performing of the layer-increasing process further comprises applying a solder resist layer on an outermost side wiring layer and treating an exposed metal surface to form a solder resist window.

* * * * *